United States Patent
Uematsu et al.

(10) Patent No.: US 8,524,575 B2
(45) Date of Patent: Sep. 3, 2013

(54) GROUP III NITRIDE CRYSTAL AND METHOD FOR PRODUCING THE SAME

(75) Inventors: Koji Uematsu, Itami (JP); Hideki Osada, Itami (JP); Seiji Nakahata, Itami (JP); Shinsuke Fujiwara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/338,263

(22) Filed: Dec. 28, 2011

(65) Prior Publication Data

US 2012/0329245 A1  Dec. 27, 2012

Related U.S. Application Data

(63) Continuation of application No. PCT/JP2010/059454, filed on Jun. 3, 2010.

(30) Foreign Application Priority Data

Jun. 29, 2009 (JP) .................. 2009-154020
Sep. 4, 2009 (JP) .................. 2009-204979

(51) Int. Cl.
*H01L 21/00* (2006.01)
*H01L 29/20* (2006.01)
*H01L 21/20* (2006.01)
*H01L 21/06* (2006.01)

(52) U.S. Cl.
USPC ........... 438/460; 438/503; 438/492; 257/615; 257/E29.089; 257/E21.09; 257/E21.599; 423/409

(58) Field of Classification Search
None
See application file for complete search history.

(56) References Cited

U.S. PATENT DOCUMENTS 8,258,051 B2 * 9/2012 Mizuhara et al. ............ 438/503
2002/0074561 A1  6/2002 Sawaki et al.
(Continued)

FOREIGN PATENT DOCUMENTS

EP  2083099 A1  7/2009
JP  2001-102307 A  4/2001
(Continued)

OTHER PUBLICATIONS

Yohei Enya et al., "531 nm Green Lasing of InGaN Based Laser Diodes on Semi-Polar {20-21} Free-Standing GaN Substrates," Applied Physics Express 2, 2009, pp. 082101-1 to 082101-3, The Japan Society of Applied Physics, Japan.

(Continued)

*Primary Examiner* — W. Wendy Kuo
*Assistant Examiner* — Moazzam Hossain
(74) *Attorney, Agent, or Firm* — Judge Patent Associates

(57) ABSTRACT

A method for producing a group III nitride crystal in the present invention includes the steps of cutting a plurality of group III nitride crystal substrates $10p$ and $10q$ having a main plane from a group III nitride bulk crystal 1, the main planes $10pm$ and $10qm$ having a plane orientation with an off-angle of five degrees or less with respect to a crystal-geometrically equivalent plane orientation selected from the group consisting of {20-21}, {20-2-1}, {22-41}, and {22-4-1}, transversely arranging the substrates $10p$ and $10q$ adjacent to each other such that the main planes $10pm$ and $10qm$ of the substrates $10p$ and $10q$ are parallel to each other and each [0001] direction of the substrates $10p$ and $10q$ coincides with each other, and growing a group III nitride crystal 20 on the main planes $10pm$ and $10qm$ of the substrates $10p$ and $10q$.

8 Claims, 9 Drawing Sheets

(56) References Cited

U.S. PATENT DOCUMENTS

| | | |
|---|---|---|
| 2002/0084467 A1 | 7/2002 | Krames et al. |
| 2005/0087753 A1 | 4/2005 | D'Evelyn et al. |
| 2006/0205199 A1 | 9/2006 | Baker et al. |
| 2007/0243653 A1 | 10/2007 | Morgan et al. |
| 2009/0236694 A1* | 9/2009 | Mizuhara et al. ............. 257/615 |

FOREIGN PATENT DOCUMENTS

| | | |
|---|---|---|
| JP | 2005-162526 A | 6/2005 |
| JP | 2006-315947 A | 11/2006 |
| JP | 2008-13772 A | 6/2008 |
| JP | 2009-52250 A | 6/2009 |
| WO | WO-2006-130696 A2 | 12/2006 |
| WO | WO-2007-084782 A2 | 7/2007 |

OTHER PUBLICATIONS

Yusuke Yoshizumi et al., "Continuous-Wave Operation of 520 nm Green InGaN-Based Laser Diodes on Semi-Polar {20-21} GaN Substrates," Applied Physics Express 2, 2009, pp. 092101-1 to 092101-3, The Japan Society of Applied Physics, Japan.

"Sumitomo Denko Jitsuyouka ni Medo," Nikkan Kogyo Shinbun, Aug. 20, 2009, p. 9, Nikkan Kogyo Shinbun, Ltd. Japan.

Tadashi Nezu, ed., "Ryokushoku Handoutai ga Tsuini Hassin / Sumitomo Denko ga Parusu Kudou ni Seikou," Nikkei Electronics, Aug. 24, 2009, p. 15, Nikkei BP Marketing, Japan.

* cited by examiner

GROUP III NITRIDE CRYSTAL AND METHOD FOR PRODUCING THE SAME

CROSS-REFERENCE TO RELATED APPLICATIONS

This application is a continuation of International Application PCT/JP2010/059454, having an international filing date of Jun. 3, 2010, which claims the benefit of priority of Japanese patent application No. 2009-154020 filed on Jun. 29, 2009 and the benefit of priority of Japanese patent application No. 2009-204979 filed on Sep. 4, 2009, each of which is hereby incorporated by reference in their entirety.

TECHNICAL FIELD

The present invention relates to a group III nitride crystal and a method for producing the group III nitride crystal and also relates to a group III nitride crystal having a main plane with a plane orientation other than {0001} and a method for producing the group III nitride crystal.

BACKGROUND ART

Group III nitride crystals suitably used in light emitting devices, electronic devices, and semiconductor sensors are generally produced by crystal growth on a main plane of a sapphire substrate having a (0001) main plane or a GaAs substrate having a (111) A main plane by a vapor-phase growth method, such as a hydride vapor phase epitaxy (HVPE) method or a metalorganic chemical vapor deposition (MOCVD) method, or a liquid-phase growth method, such as a flux method. Thus, group III nitride crystals generally produced have a main plane with a {0001} plane orientation.

A light emitting device in which a light-emitting layer having a multi-quantum well (MQW) structure is formed on a main plane of a group III nitride crystal substrate having the main plane with a {0001} plane orientation generates spontaneous polarization in the light-emitting layer because of the polarity of the group III nitride crystal in a <0001> direction. The spontaneous polarization reduces luminous efficiency. Thus, there is a demand for the production of a group III nitride crystal having a main plane with a plane orientation other than {0001}.

The following methods have been proposed as a method for producing a group III nitride crystal having a main plane with a plane orientation other than {0001}. For example, Japanese Unexamined Patent Application Publication No. 2005-162526 (Patent Literature 1) discloses the following method for producing a GaN crystal having a surface with any plane orientation independent of the substrate plane orientation. A plurality of rectangular parallelepiped crystalline masses are cut from a GaN crystal grown by a vapor-phase growth method. After a silicon oxide film is formed on the surface of a sapphire substrate prepared separately, a plurality of depressions reaching the substrate are formed. The plurality of crystalline masses are embedded in the depressions such that the top surfaces of the crystalline masses are unidirectionally oriented. Gallium nitride crystals having a surface with a certain plane orientation are then grown by a vapor-phase growth method using the crystalline masses as seeds.

Japanese Unexamined Patent Application Publication No. 2006-315947 (Patent Literature 2) discloses the following method for producing a nitride semiconductor wafer that can achieve both a low dislocation density and a large area. A primary wafer formed of a hexagonal nitride semiconductor and having two facing main C planes is prepared. The primary wafer is then cut along an M plane to produce a plurality of nitride semiconductor bars. The plurality of nitride semiconductor bars are then arranged such that the C planes of adjacent nitride semiconductor bars face each other and the M plane of each of the nitride semiconductor bars becomes the top surface. A nitride semiconductor is then regrown on the top surfaces of the arranged nitride semiconductor bars to form a nitride semiconductor layer having a continuous M plane as the main plane.

Japanese Unexamined Patent Application Publication No. 2008-143772 (Patent Literature 3) discloses the following method for producing a high-crystallinity group III nitride crystal that has a main plane other than {0001}. A plurality of group III nitride crystal substrates having a main plane with a certain plane orientation are cut from a group III nitride bulk crystal. The substrates are then transversely arranged adjacent to each other such that the main planes of the substrates are parallel to each other and the substrates have the same [0001] direction. A group III nitride crystal is then grown on the main planes of the substrates.

CITATION LIST

Patent Literature
PTL 1: Japanese Unexamined Patent Application Publication No. 2005-162526
PTL 2: Japanese Unexamined Patent Application Publication No. 2006-315947
PTL 3: Japanese Unexamined Patent Application Publication No. 2008-143772

SUMMARY OF INVENTION

Technical Problem

However, in the method according to Japanese Unexamined Patent Application Publication No. 2005-162526 (Patent Literature 1), in which GaN crystals are grown using crystalline masses of GaN crystals embedded in the sapphire substrate as seeds, a difference in thermal expansion coefficient between sapphire and GaN results in the generation of a crack or strain in the GaN crystals during cooling after crystal growth. Thus, this method could not produce high-crystallinity GaN crystals.

The method according to Japanese Unexamined Patent Application Publication No. 2006-315947 (Patent Literature 2) only produces a nitride semiconductor wafer having an M plane as a main plane. Furthermore, when a nitride semiconductor layer is grown using the M plane as a main plane at a high growth rate, polycrystals are deposited on the main plane. It is therefore difficult to produce a thick nitride semiconductor layer having high crystallinity.

In the method according to Japanese Unexamined Patent Application Publication No. 2008-143772 (Patent Literature 3), a group III nitride crystal is grown on a main plane with a certain plane orientation. Thus, the certain plane orientation includes a plane orientation in which a crystal is stably grown and a plane orientation in which a crystal is unstably grown. In the plane orientation in which a crystal is stably grown, it is difficult to produce a thick group III nitride crystal because of a low growth rate of the group III nitride crystal. In the plane orientation in which a crystal is unstably grown, it is difficult to perform stable epitaxial growth of a group III nitride crystal, and the group III nitride crystal thus grown tends to have a crack.

It is an object of the present invention to solve the problems described above and provide a high-crystallinity group III nitride crystal having a main plane with a plane orientation other than {0001} and a method for producing a group III nitride crystal in which the group III nitride crystal can be grown at a high crystal growth rate.

Solution to Problem

The present invention provides a method for producing a group III nitride crystal includes the steps of: cutting a plurality of group III nitride crystal substrates having a main plane from a group III nitride bulk crystal, the main plane having a plane orientation with an off-angle of five degrees or less with respect to a crystal-geometrically equivalent plane orientation selected from the group consisting of {20-21}, {20-2-1}, {22-41}, and {22-4-1}; transversely arranging the substrates adjacent to each other such that the main planes of the substrates are parallel to each other and the substrates have the same [0001] direction; and growing a group III nitride crystal on the main planes of the substrates.

In a method for producing a group III nitride crystal according to the present invention, the main planes of the substrates may have a plane orientation with an off-angle of five degrees or less with respect to a crystal-geometrically equivalent plane orientation selected from the group consisting of {20-2-1} and {20-21}. The average roughness Ra of each contact surface of the substrates adjacent to each other may be 50 nm or less. A method for growing the group III nitride crystal may be a hydride vapor phase epitaxy method.

In the step of growing a group III nitride crystal of a method for producing a group III nitride crystal according to the present invention, the crystal growth face of the group III nitride crystal may be kept flat. In the step of growing a group III nitride crystal on the main planes of the group III nitride crystal substrates, when the plane orientation of the main planes has an off-angle of five degrees or less with respect to {20-21}, the group III nitride crystal may have a growth rate below 80 μm/h, when the plane orientation of the main planes has an off-angle of five degrees or less with respect to {20-2-1}, the group III nitride crystal may have a growth rate below 90 μm/h, when the plane orientation of the main planes has an off-angle of five degrees or less with respect to {22-41}, the group III nitride crystal may have a growth rate below 60 μm/h, and when the plane orientation of the main planes has an off-angle of five degrees or less with respect to {22-4-1}, the group III nitride crystal may have a growth rate below 80 μm/h.

In the step of growing a group III nitride crystal of a method for producing a group III nitride crystal according to the present invention, the group III nitride crystal may have at least one of the following impurity atom concentrations: an oxygen atom concentration of $1 \times 10^{16}$ cm$^{-3}$ or more and $4 \times 10^{19}$ cm$^{-3}$ or less, a silicon atom concentration of $6 \times 10^{14}$ cm$^{-3}$ or more and $5 \times 10^{18}$ cm$^{-3}$ or less, a hydrogen atom concentration of $6 \times 10^{16}$ cm$^{-3}$ or more and $1 \times 10^{18}$ cm$^{-3}$ or less, and a carbon atom concentration of $1 \times 10^{16}$ cm$^{-3}$ or more and $1 \times 10^{18}$ cm$^{-3}$ or less.

A group III nitride crystal according to the present invention is a group III nitride crystal having a main plane with a crystal-geometrically equivalent plane orientation selected from the group consisting of {20-21}, {20-2-1}, {22-41}, and {22-4-1}. The group III nitride crystal has at least one of the following impurity atom concentrations: an oxygen atom concentration of $1 \times 10^{16}$ cm$^{-3}$ or more and $4 \times 10^{19}$ cm$^{-3}$ or less, a silicon atom concentration of $6 \times 10^{14}$ cm$^{-3}$ or more and $5 \times 10^{18}$ cm$^{-3}$ or less, a hydrogen atom concentration of $6 \times 10^{16}$ cm$^{-3}$ or more and $1 \times 10^{18}$ cm$^{-3}$ or less, and a carbon atom concentration of $1 \times 10^{16}$ cm$^{-3}$ or more and $1 \times 10^{18}$ cm$^{-3}$ or less. The group III nitride crystal may have a main plane having an area of 10 cm$^2$ or more.

Advantageous Effects of Invention

The present invention can provide a high-crystallinity group III nitride crystal having a main plane with a plane orientation other than {0001}, and a method for producing the group III nitride crystal in which the group III nitride crystal can be grown at a high crystal growth rate.

BRIEF DESCRIPTION OF DRAWINGS

FIG. 1 is a schematic cross-sectional view illustrating a method for producing a group III nitride crystal according to an embodiment of the present invention.

FIG. 2 is a schematic cross-sectional view illustrating a method for producing a group III nitride crystal according to another embodiment of the present invention.

FIG. 3 is a schematic cross-sectional view illustrating a method for producing a group III nitride crystal according to still another embodiment of the present invention.

FIG. 4 is a schematic cross-sectional view illustrating a method for producing a group III nitride crystal according to still another embodiment of the present invention.

FIG. 5 is a schematic view of a base substrate on which a group III nitride bulk crystal is to be grown.

DESCRIPTION OF EMBODIMENTS

Figure 1A:
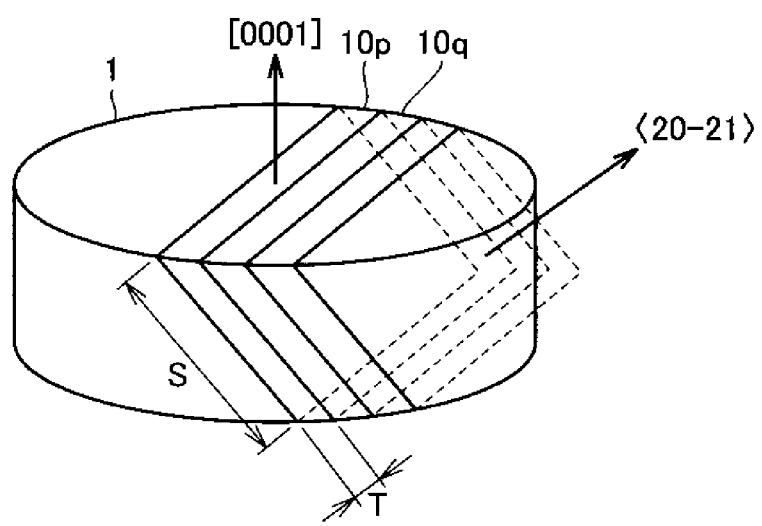
FIG. 1A illustrates the step of cutting group III nitride crystal substrates.

In crystal geometry, indices (Miller indices), such as (hkl) and (hkil), are used to indicate the plane orientation of a crystal face. The plane orientation of a crystal face of a hexagonal crystal, such as a group III nitride crystal, is indicated by (hkil), wherein h, k, i, and l are integers called Miller indices and have the relationship of i=−(h+k). A plane with the plane orientation (hkil) is referred to as a (hkil) plane. A direction perpendicular to the (hkil) plane (a direction normal to the (hkil) plane) is referred to as a [hkil] direction. {hkil} denotes a generic plane orientation including (hkil) and plane orientations crystal-geometrically equivalent to (hkil). <hkil> denotes a generic direction including [hkik] and directions crystal-geometrically equivalent to [hkik]

A group III nitride crystal contains group III atomic planes and nitrogen atomic planes alternately disposed in the <0001> direction and consequently have polarity in the <0001> direction. In the present application, the crystallographic axis is determined such that the group III atomic plane is the (0001) plane and the nitrogen atomic plane is the (000-1) plane.

(First Embodiment)

With reference to FIGS. 1 to 4, a method for producing a group III nitride crystal according to an embodiment of the present invention includes the following steps: cutting a plurality of group III nitride crystal substrates 10p and 10q having main planes 10pm and 10qm from a group III nitride bulk crystal 1, the main plane having a plane orientation with an off-angle of five degrees or less with respect to a crystal-geometrically equivalent plane orientation selected from the group consisting of {20-21}, {20-2-1}, {22-41}, and {22-4-1} (hereinafter also referred to as a substrate cutting step; see FIGS. 1A to 4A); transversely arranging the group III nitride crystal substrates 10p and 10q adjacent to each other such that the main planes 10pm and 10qm of the group III nitride crystal substrates 10p and 10q are parallel to each other and each [0001] direction of the group III nitride crystal substrates 10p and 10q is the same (hereinafter also referred to as a substrate arranging step; see FIGS. 1B to 4B); and growing a group III nitride crystal 20 on the main planes 10pm and 10qm of the substrates 10p and 10q (hereinafter also referred to as a crystal growing step; see FIGS. 1C to 4C).

In accordance with a method for producing a group III nitride crystal according to the present embodiment, a high-crystallinity group III nitride crystal having a main plane with a plane orientation other than {0001} can be grown at a high crystal growth rate by growing the group III nitride crystal on a plurality of group III nitride crystal substrates 10p and 10q having the main planes 10pm and 10qm with a plane orientation with an off-angle of five degrees or less with respect to a crystal-geometrically equivalent plane orientation selected from the group consisting of {20-21}, {20-2-1}, {22-41}, and {22-4-1}.

A method for producing a group III nitride crystal according to the present embodiment will be further described in detail below with reference to FIGS. 1 to 4.

With reference to FIGS. 1A to 4A, in the substrate cutting step according to the present embodiment, a plurality of group III nitride crystal substrates 10p and 10q having main planes 10pm and 10qm are cut from group III nitride bulk crystal 1. The main planes 10pm and 10qm have a plane orientation with an off-angle of five degrees or less with respect to a crystal-geometrically equivalent plane orientation selected from the group consisting of {20-21}, {20-2-1}, {22-41}, and {22-4-1}. The term "off-angle", as used herein, refers to an angle between one plane orientation and the other plane orientation and can be measured by an X-ray diffraction method.

The group III nitride bulk crystal 1 used in the substrate cutting step is not particularly limited and may be produced by growing a crystal on a main plane of a sapphire substrate having a (0001) main plane or a GaAs substrate having a (111) A plane as a main plane by a common method, for example, a vapor-phase growth method, such as a HVPE method or a MOCVD method, or a liquid-phase growth method, such as a flux method. Thus, the group III nitride bulk crystal generally, but not always, has a {0001} main plane. In order to reduce dislocation density and increase crystallinity, the group III nitride bulk crystal 1 is preferably grown by a facet growth method, as disclosed in Japanese Unexamined Patent Application Publication No. 2001-102307. In the facet growth method, a facet is formed on a plane on which a crystal is to be grown (a crystal growth face) and the crystal is grown without embedding the facet.

A plurality of group III nitride crystal substrates 10p and 10q having the main planes 10pm and 10qm with a plane orientation with an off-angle of five degrees or less with respect to a crystal-geometrically equivalent plane orientation selected from the group consisting of {20-21}, {20-2-1}, {22-41}, and {22-4-1} may be cut from the group III nitride bulk crystal 1 by any method. For example, as illustrated in FIGS. 1A to 4A, the group III nitride crystal substrates 10p and 10q may be cut from the group III nitride bulk crystal 1 at predetermined intervals along a plurality of planes perpendicular to one of the <20-21> direction, the <20-2-1> direction, the <22-41> direction, and the <22-4-1> direction (These planes have a plane orientation crystal-geometrically equivalent to one of {20-21}, {20-2-1}, {22-41}, and {22-4-1}. The same applies hereinafter.)

As illustrated in FIGS. 1B to 4B, in the substrate arranging step according to the present embodiment, the plurality of group III nitride crystal substrates 10p and 10q cut out are transversely arranged adjacent to each other such that the main planes 10pm and 10qm of the substrates 10p and 10q are parallel to each other and each [0001] direction of the substrates 10p and 10q is the same. In FIGS. 1B to 4B, although reference signs are given to two adjacent group III nitride crystal substrates 10p and 10q of the plurality of group III nitride crystal substrates, the same applies to other adjacent group III nitride crystal substrates.

Variations in the angle between the crystallographic axis and the main planes of the plurality of group III nitride crystal substrates 10p and 10q within the main planes result in a inhomogeneous composition of the group III nitride crystal grown on the main planes of the substrates 10p and 10q within planes parallel to the main planes of the substrates 10p and 10q. The substrates 10p and 10q are therefore transversely arranged such that the main planes 10pm and 10qm of the substrates 10p and 10q are parallel to each other. The main planes 10pm and 10qm of the substrates 10p and 10q parallel to each other do not necessarily lie in the same plane. The height difference ΔT (not shown) between the main planes 10pm and 10qm of the adjacent two group III nitride crystal substrates 10p and 10q is preferably 0.1 mm or less, more preferably 0.01 mm or less.

In order to unidirectionally arrange the crystal orientation of the plurality of group III nitride crystal substrates 10p and 10q to achieve more uniform crystal growth, the substrates 10p and 10q are transversely arranged such that each [0001] direction of the substrates 10p and 10q is the same. A gap between the plurality of group III nitride crystal substrates 10p and 10q results in low crystallinity of crystals grown on the gap. The group III nitride crystal substrates 10p and 10q are therefore arranged in contact with each other.

With reference to FIGS. 1A to 4A and FIGS. 1B to 4B, the substrate cutting step and the substrate arranging step yield the plurality of group III nitride crystal substrates 10p and 10q from the group III nitride bulk crystal 1. The group III nitride crystal substrates 10p and 10q are transversely arranged such that the main planes 10pm and 10qm of the plurality of group III nitride crystal substrates 10p and 10q are parallel to each other and each [0001] direction of the substrates 10p and 10q is the same. The group III nitride crystal substrates 10p and 10q have the main planes 10pm and 10qm with a plane orientation with an off-angle of five degrees or less with respect to a crystal-geometrically equivalent plane orientation selected from the group consisting of {20-21}, {20-2-1}, {22-41}, and {22-4-1}.

With reference to FIGS. 1C to 4C, in the crystal growing step according to the present embodiment, a group III nitride crystal 20 is grown on the main planes 10pm and 10qm of the plurality of group III nitride crystal substrates 10p and 10q. The group III nitride crystal 20 is grown by epitaxial growth.

The main planes 10pm and 10qm of the plurality of group III nitride crystal substrates 10p and 10q have a plane orientation with an off-angle of five degrees or less with respect to a crystal-geometrically equivalent plane orientation selected from the group consisting of {20-21}, {20-2-1}, {22-41}, and {22-4-1}. Thus, a main plane 20m of the group III nitride crystal 20 epitaxially grown on the main planes 10pm and 10qm has the same plane orientation as the main planes 10pm and 10qm of the plurality of group III nitride crystal substrates 10p and 10q (that is, a plane orientation with an off-angle of five degrees or less with respect to a crystal-geometrically equivalent plane orientation selected from the group consisting of {20-21}, {20-2-1}, {22-41}, and {22-4-1}).

Since the group III nitride crystal 20 is grown on the main planes 10pm and 10qm of the plurality of group III nitride crystal substrates 10p and 10q, and the substrates 10p and 10q and the group III nitride crystal 20 grown have a small difference in thermal expansion coefficient, a crack and strain rarely occur in the group III nitride crystal 20 during cooling after crystal growth, thus yielding a high-crystallinity group III nitride crystal.

From the perspective described above, the plurality of group III nitride crystal substrates 10p and 10q and the group III nitride crystal 20 grown preferably have the same chemical composition. These steps can yield a high-crystallinity group III nitride crystal 20 having the main plane 20m with a plane orientation with an off-angle of five degrees or less with respect to a crystal-geometrically equivalent plane orientation selected from the group consisting of {20-21}, {20-2-1}, {22-41}, and {22-4-1}.

In the method for producing a group III nitride crystal according to the present embodiment, the main planes 10pm and 10qm of the plurality of group III nitride crystal substrates 10p and 10q have a plane orientation with an off-angle of five degrees or less with respect to a crystal-geometrically equivalent plane orientation selected from the group consisting of {20-21}, {20-2-1}, {22-41}, and {22-4-1}. Thus, the high-crystallinity group III nitride crystal 20 having the main plane 20m with a plane orientation with an off-angle of five degrees or less with respect to a crystal-geometrically equivalent plane orientation selected from the group consisting of {20-21}, {20-2-1}, {22-41}, and {22-4-1} can be stably grown on the main planes 10pm and 10qm of the plurality of group III nitride crystal substrates 10p and 10q at a high crystal growth rate.

The group III nitride crystal 20 thus formed has a large crystal thickness and consequently a high degree of freedom of cutting direction. Thus, a group III nitride crystal and a group III nitride crystal substrate having any plane orientation other than the crystal-geometrically equivalent plane orientation selected from the group consisting of {20-21}, {20-2-1}, {22-41}, and {22-4-1} can be formed.

When the plane orientation of the main planes 10pm and 10qm of the plurality of group III nitride crystal substrates 10p and 10q has an off-angle above five degrees with respect to a crystal-geometrically equivalent plane orientation selected from the group consisting of {20-21}, {20-2-1}, {22-41}, and {22-4-1}, it is difficult to stably grow a high-crystallinity group III nitride crystal on the main planes 10pm and 10qm.

In the method for producing a group III nitride crystal according to the present embodiment, in order to more stably grow a group III nitride crystal 20 having higher crystallinity at a higher crystal growth rate, the main planes 10pm and 10qm of the plurality of group III nitride crystal substrates 10p and 10q preferably have a plane orientation with an off-angle of five degrees or less with respect to a crystal-geometrically equivalent plane orientation selected from the group consisting of {20-2-1} and {20-21}.

In the method for producing a group III nitride crystal according to the present embodiment, each of the contact surfaces (hereinafter referred to as contact surfaces 10pt and 10qt) of the plurality of group III nitride crystal substrates 10p and 10q adjacent to each other preferably has an average roughness Ra of 50 nm or less, more preferably 5 nm or less. When each of the contact surfaces 10pt and 10qt has an average roughness Ra above 50 nm, a region of the group III nitride crystal 20 on the neighborhood of the contact surfaces 10pt and 10qt (hereinafter referred to as a region-on-substrate-interface 20t) has low crystallinity.

The region-on-substrate-interface 20t is disposed on both sides of a vertical plane 20tc extending upward from one end of the substrate contact surfaces 10pt and 10qt. The width $\Delta W$ of the region-on-substrate-interface 20t depends on the average surface roughness Ra of the contact surfaces 10pt and 10qt and the growth conditions and crystallinity of the group III nitride crystal. The width $\Delta W$ ranges from approximately 10 to 1000 μm. A region-on-substrate 20s (A region on the plurality of group III nitride crystal substrates 10p and 10q other than the region-on-substrate-interface. The same applies hereinafter.) and the region-on-substrate-interface 20t can be differentiated by comparing the full widths at half maximum of X-ray diffraction peaks and/or the threading dislocation densities of the main planes in these regions.

The average surface roughness Ra refers to the arithmetical mean roughness Ra defined in JIS B 0601. More specifically, in a portion having a reference length taken from a roughness profile in the direction of an average line, the total of distances between the average line and the roughness profile (absolute deviations) is averaged over the reference length. The average surface roughness Ra can be measured with an atomic force microscope (AFM).

In order for the contact surfaces 10pt and 10qt of the plurality of group III nitride crystal substrates 10p and 10q to have an average roughness Ra of 50 nm or less, the method for producing a group III nitride crystal according to the present embodiment preferably includes the step of grinding and/or polishing side surfaces of the plurality of group III nitride crystal substrates 10p and 10q serving as the contact surfaces 10pt and 10qt (hereinafter referred to as a grinding/polishing step) after the substrate cutting step and before the substrate arranging step.

In order to further increase the crystallinity of a group III nitride crystal to be grown, the method for producing a group III nitride crystal according to the present embodiment preferably further includes the step of grinding and/or polishing the main planes 10pm and 10qm, on which a group III nitride crystal is to be grown, of the plurality of group III nitride crystal substrates 10p and 10q (a grinding/polishing step) after the substrate cutting step and before the substrate arranging step. After the grinding/polishing step, each of the main planes 10pm and 10qm preferably has a surface roughness of 50 nm or less, more preferably 5 nm or less.

In the method for producing a group III nitride crystal according to the present embodiment, a method for growing the group III nitride crystal 20 is not particularly limited and may be a common method, for example, a vapor-phase growth method, such as a HVPE method or a MOCVD method, or a liquid-phase growth method, such as a flux method. Among these production methods, the HVPE method is preferred because of a high crystal growth rate.

With reference to FIGS. 1C to 4C, the left side of a central wavy line indicates the case where the group III nitride crystal 20 grows and forms a flat main plane 20m while a crystal growth face 20g is kept flat, and the right side of the central wavy line indicates the case where the group III nitride crystal 20 grows while forming a plurality of facets 20gf on the crystal growth face 20g and forms a main plane 20m having a plurality of facets 20mf.

With reference to the left side of the central wavy line in FIGS. 1C to 4C, in the step of growing a group III nitride crystal in the method for producing a group III nitride crystal according to the present embodiment, the group III nitride crystal 20 is preferably grown while the crystal growth face 20g is kept flat. The clause "the crystal growth face 20g is kept flat", as used herein, means that the crystal growth face 20g is substantially flat and forms no facet 20gf.

In the step of growing a group III nitride crystal according to the present embodiment, the group III nitride crystal 20 is grown on the main planes 10pm and 10qm of the plurality of group III nitride crystal substrates 10p and 10q. The main planes 10pm and 10qm have a plane orientation with an off-angle of five degrees or less with respect to a crystal-geometrically equivalent plane orientation selected from the group consisting of {20-21}, {20-2-1}, {22-41}, and {22-4-1}. The group III nitride crystal grows in one of the <20-21> direction, the <20-2-1> direction, the <22-41> direction, and the <22-4-1> direction. The group III nitride crystal 20 grown in that direction tends to have a planar defect in the {0001} plane (since the (0001) in-plane and the (000-1) in-plane are the same in-plane, they are hereinafter collectively referred to as the {0001} in-plane) and low crystallinity.

With reference to the right side of the central wavy line in FIGS. 1C to 4C, a particular increase in the growth rate of the group III nitride crystal 20 results in the formation of a plurality of facets 20gf on the crystal growth face 20g, which is accompanied by an increase in the density of planar defects in the {0001} plane, resulting in low crystallinity.

Thus, in the growth of the group III nitride crystal 20, keeping the crystal growth face 20g flat without forming a plurality of facets 20gf on the crystal growth face 20g can reduce the density of planar defects in the {0001} plane of the group III nitride crystal 20 grown, thereby yielding a high-crystallinity group III nitride crystal. The density of planar defects in the {0001} plane of the group III nitride crystal may be determined by cathodoluminescence (CL) of a cross section perpendicular to the direction of the main plane of the group III nitride crystal tilting from the (0001) plane or the (000-1) plane.

In the growth of the group III nitride crystal 20, the crystal growth face 20g can be kept flat at a growth rate of the group III nitride crystal 20 below a predetermined rate. The growth rate at which the crystal growth face 20g can be kept flat depends on the plane orientation of the main planes 10pm and 10qm of the plurality of group III nitride crystal substrates 10p and 10q as described below. When the plane orientation of the main planes of the group III nitride crystal substrates has an off-angle of five degrees or less with respect to {20-21}, the growth rate of the group III nitride crystal is below 80 μm/h. When the plane orientation of the main planes of the group III nitride crystal substrates has an off-angle of five degrees or less with respect to {20-2-1}, the growth rate of the group III nitride crystal is below 90 μm/h. When the plane orientation of the main planes of the group III nitride crystal substrates has an off-angle of five degrees or less with respect to {22-41}, the growth rate of the group III nitride crystal is below 60 μm/h. When the plane orientation of the main planes of the group III nitride crystal substrates has an off-angle of five degrees or less with respect to {22-4-1}, the growth rate of the group III nitride crystal is below 80 μm/h.

In the growth of a group III nitride crystal, when the growth rate of the group III nitride crystal 20 is equal to or more than the predetermined rate, a plurality of facets 20gf are formed on the crystal growth face 20g of the group III nitride crystal 20. The plurality of facets 20gf have the shape of a plurality of stripes. Each of the stripe-shaped facets 20gf extends in a direction perpendicular to the direction of the crystal growth face 20g tilting from the (0001) plane or the (000-1) plane. Each stripe of the facets 20gf has a width and a depth in the range of approximately 2 to 300 μm. The formation of the facets 20gf on the crystal growth face 20g during the growth of the group III nitride crystal 20 causes planar defects in the {0001} plane of the group III nitride crystal 20, thus decreasing crystallinity. A plurality of facets 20mf formed on the main plane 20m of the group III nitride crystal 20 during such growth have a shape, a direction, a width, and a depth similar to those of the plurality of facets 20gf formed on the crystal growth face 20g. The group III nitride crystal 20 has depressions 20v formed of the plurality of facets 20mf in the main plane 20m.

In the step of growing a group III nitride crystal, a group III nitride crystal 20 having at least one of the following impurity atom concentrations is preferably grown: an oxygen atom concentration of $1 \times 10^{16}$ cm$^{-3}$ or more and $4 \times 10^{19}$ cm$^{-3}$ or less, a silicon atom concentration of $6 \times 10^{14}$ cm$^{-3}$ or more and $5 \times 10^{18}$ cm$^{-3}$ or less, a hydrogen atom concentration of $6 \times 10^{16}$ cm$^{-3}$ or more and $1 \times 10^{18}$ cm$^{-3}$ or less, and a carbon atom concentration of $1 \times 10^{16}$ cm$^{-3}$ or more and $1 \times 10^{18}$ cm$^{-3}$ or less. The concentrations of the impurity atoms of a group III nitride crystal, such as an oxygen atom, a silicon atom, a hydrogen atom, and a carbon atom can be measured by secondary ion mass spectrometry (hereinafter also referred to as SIMS).

Setting at least one impurity concentration of the oxygen atom concentration, the silicon atom concentration, the hydrogen atom concentration, and the carbon atom concentration of a group III nitride crystal to the predetermined concentration described above can reduce the density of planar defects in the {0001} plane, yielding a high-crystallinity group III nitride crystal. Coalescence of dislocations in the growth of a group III nitride crystal reduces the number of dislocations and the volume of the crystal, thereby warping the crystal and increasing planar defects. Setting the impurity atom concentration to the predetermined concentration described above probably reduces the decrease in crystal volume, reducing the density of planar defects. At an impurity atom concentration below the predetermined concentration, the decrease in crystal volume cannot probably be reduced, which makes it difficult to reduce the formation of planar defects in the {0001} plane. On the other hand, at an impurity atom concentration above the predetermined concentration, impurity atoms are probably condensed in the (0001) plane, making it difficult to reduce the formation of planar defects in the {0001} plane.

From the perspective described above, the oxygen atom concentration is more preferably $5 \times 10^{16}$ cm$^{-3}$ or more and $1 \times 10^{19}$ cm$^{-3}$ or less, still more preferably $1 \times 10^{17}$ cm$^{-3}$ or more and $8 \times 10^{18}$ cm$^{-3}$ or less. The silicon atom concentration is more preferably $1 \times 10^{15}$ cm$^{-3}$ or more and $3 \times 10^{18}$ cm$^{-3}$ or less, still more preferably $1 \times 10^{16}$ cm$^{-3}$ or more and $1 \times 10^{18}$ cm$^{-3}$ or less. The hydrogen atom concentration is more preferably $1 \times 10^{17}$ cm$^{-3}$ or more and $9 \times 10^{17}$ cm$^{-3}$ or less, still more preferably $2 \times 10^{17}$ cm$^{-3}$ or more and $7 \times 10^{17}$ cm$^{-3}$ or less. The carbon atom concentration is more preferably $5 \times 10^{16}$ cm$^{-3}$ or more and $9 \times 10^{17}$ cm$^{-3}$ or less, still more preferably $9 \times 10^{16}$ cm$^{-3}$ or more and $7 \times 10^{17}$ cm$^{-3}$ or less.

In order to further reduce the formation of planar defects in the {0001} plane during the growth of a group III nitride crystal, more preferably two, still more preferably three, most preferably four, of the impurity atom concentrations described above (the oxygen atom concentration, the silicon atom concentration, the hydrogen atom concentration, and the carbon atom concentration) satisfy the predetermined concentrations.

In a method for growing a group III nitride crystal, an impurity atom may be added to a group III nitride crystal by any method, including the following methods. Oxygen atoms may be added using $O_2$ gas (oxygen gas), $O_2$ gas diluted with an inert gas, such as $N_2$ gas, Ar gas, or He gas, a carrier gas (such as $H_2$ gas or $N_2$ gas) containing $H_2O$, or a raw material gas (such as HCl gas or $NH_3$ gas) containing $H_2O$. A quartz container may be used as a crystal growth container to allow quartz of the reaction vessel to react with a raw material $NH_3$ gas, producing $H_2O$ gas to be used. Silicon atoms may be added using a silicon compound gas, such as $SiH_4$ gas, $SiH_3Cl$ gas, $SiH_2Cl_2$ gas, $SiHCl_3$ gas, $SiCl_4$ gas, or $SiF_4$. A quartz container may be used as a crystal growth container to allow quartz of the reaction vessel to react with a raw material $NH_3$ gas, producing a silicon-containing gas to be used. Hydrogen atoms may be added using a gas mixture of a carrier gas, such as $H_2$ gas, and an inert gas, such as $N_2$ gas, Ar gas, or He gas. Carbon atoms may be added using a carbon compound gas, such as $CH_4$ gas. A carbon material (for example, a carbon plate) may be placed in a crystal growth container to allow carbon of the carbon material to react with hydrogen gas serving as a carrier gas or $HN_3$ gas serving as a raw material gas, producing a carbon-containing gas to be used.

A method for preventing the contamination of a group III nitride crystal with an impurity atom may be the following method. The contamination with oxygen atoms and silicon atoms may be prevented by not using a gas containing oxygen atoms and silicon atoms and covering the inner wall of a crystal growth container containing oxygen atoms and/or silicon atoms with a material containing neither oxygen atoms nor silicon atoms, such as BN. The contamination with hydrogen atoms may be prevented by not using a carrier gas containing hydrogen gas. The contamination with carbon atoms may be prevented by using neither a carbon material nor a gas containing carbon atoms.

With reference to FIGS. 1C to 4C and FIGS. 1D to 4D, a method for producing a group III nitride crystal according to the present embodiment may include the steps of preparing an additional group III nitride crystal substrate 20p having a main plane 20pm from the group III nitride crystal 20 grown as described above, the main plane 20pm having a plane orientation with an off-angle of five degrees or less with respect to a crystal-geometrically equivalent plane orientation selected from the group consisting of {20-21}, {20-2-1}, {22-41}, and {22-4-1}, and growing an additional group III nitride crystal 30 on the main plane 20pm of the additional group III nitride crystal substrate 20p. These steps can yield an additional high-crystallinity group III nitride crystal 30 having the main plane 30m with a plane orientation with an off-angle of five degrees or less with respect to a crystal-geometrically equivalent plane orientation selected from the group consisting of {20-21}, {20-2-1}, {22-41}, and {22-4-1}.

The step for preparing an additional group III nitride crystal substrate 20p is not particularly limited and may be performed by cutting a plane parallel to the main planes 10pm and 10qm of the plurality of group III nitride crystal substrates 10p and 10q from the group III nitride crystal 20 grown. In order to grow an additional group III nitride crystal 30 having high crystallinity on the main plane 20pm, the main plane 20pm of the additional group III nitride crystal substrate 20p thus cut out preferably has an average roughness Ra of 50 nm or less, more preferably 5 nm or less. In order for the main plane 20pm of the group III nitride crystal substrate 20p to have an average roughness Ra of 50 nm or less, after the group III nitride crystal substrate 20p is cut out and before the additional group III nitride crystal 30 is grown, the main plane 20pm of the group III nitride crystal substrate 20p is preferably ground and/or polished.

In the method for producing a group III nitride crystal according to the present embodiment, a method for growing the additional group III nitride crystal 30 is not particularly limited and may be a common method, for example, a vapor-phase growth method, such as a HVPE method or a MOCVD method, or a liquid-phase growth method, such as a flux method. Among these production methods, the HVPE method is preferred because of a high crystal growth rate.

With reference to FIGS. 1D to 4D, the left side of a central wavy line indicates the case where the group III nitride crystal 30 grows and forms a flat main plane 30m while a crystal growth face 30g is kept flat, and the right side of the central wavy line indicates the case where the group III nitride crystal 30 grows while forming a plurality of facets 30gf on the crystal growth face 30g and forms a main plane 30m having a plurality of facets 30mf.

With reference to the left side of the central wavy line in FIGS. 1D to 4D, in the step of growing an additional group III nitride crystal in the method for producing a group III nitride crystal according to the present embodiment, the additional group III nitride crystal 30 is preferably grown while the crystal growth face 30g is kept flat. The clause "the crystal growth face 30g is kept flat", as used herein, means that the crystal growth face 30g is substantially flat and forms no facet 30gf.

Also in the growth of the additional group III nitride crystal 30 according to the present embodiment, the additional group III nitride crystal 30 grown in one of the <20-21> direction, the <20-2-1> direction, the <22-41> direction, and the <22-4-1> direction tends to have a planar defect in the {0001} plane and low crystallinity.

With reference to the right side of the central wavy line in FIGS. 1D to 4D, a particular increase in the growth rate of the additional group III nitride crystal 30 results in the formation of a plurality of facets 30gf on the crystal growth face 30g, which is accompanied by an increase in the density of planar defects in the {0001} plane, resulting in low crystallinity.

Thus, in the growth of the additional group III nitride crystal 30, keeping the crystal growth face 30g flat without forming a plurality of facets 30gf on the crystal growth face 30g can reduce the density of planar defects in the {0001} plane of the additional group III nitride crystal 30 grown, thereby yielding a high-crystallinity group III nitride crystal.

In the growth of the additional group III nitride crystal 30, the crystal growth face 30g can be kept flat at a growth rate of the additional group III nitride crystal 30 below a predetermined rate. The growth rate at which the crystal growth face 30g can be kept flat depends on the plane orientation of the main plane 20pm of the additional group III nitride crystal substrate 20p as described below. When the plane orientation of the main plane of the additional group III nitride crystal substrate has an off-angle of five degrees or less with respect to {20-21}, the growth rate of the additional group III nitride crystal is below 140 μm/h. When the plane orientation of the main plane of the additional group III nitride crystal substrate has an off-angle of five degrees or less with respect to {20-2-1}, the growth rate of the additional group III nitride crystal is below 150 μm/h. When the plane orientation of the main plane of the additional group III nitride crystal substrate has an off-angle of five degrees or less with respect to {22-41}, the growth rate of the additional group III nitride crystal is below 120 μm/h. When the plane orientation of the main plane of the additional group III nitride crystal substrate has an off-angle of five degrees or less with respect to {22-4-1}, the growth rate of the additional group III nitride crystal is below 140 μm/h.

Thus, even at a high crystal growth rate, the crystal growth face is more easily kept flat in the growth of the additional group III nitride crystal 30 than in the growth of the group III nitride crystal 20. This is probably because the group III nitride crystal 20 is grown on the main planes 10pm and 10qm of the adjacent group III nitride crystal substrates 10p and 10q whereas the additional group III nitride crystal 30 is grown on the main plane 20pm of the additional group III nitride crystal substrate 20p and can consequently be grown more uniformly over the entire surface of the substrate.

In the growth of the additional group III nitride crystal, when the growth rate of the additional group III nitride crystal 30 is equal to or more than the predetermined rate, a plurality of facets 30gf are formed on the crystal growth face 30g of the additional group III nitride crystal 30. The plurality of facets 30gf have the shape of a plurality of stripes. Each of the stripe-shaped facets 30gf extends in a direction perpendicular to the direction of the crystal growth face 30g tilting from the (0001) plane or the (000-1) plane. Each stripe of the facets 30gf has a width and a depth in the range of approximately 2 to 300 μm. The formation of the facets 20gf on the crystal growth face 20g during the growth of the group III nitride crystal 20 causes planar defects in the {0001} plane of the group III nitride crystal 20, thus decreasing crystallinity. A plurality of facets 30mf formed on the main plane 30m of the group III nitride crystal 30 during growth have a shape, a direction, a width, and a depth similar to those of the plurality of facets 30gf formed on the crystal growth face 30g. The group III nitride crystal 30 has depressions 30v formed of the plurality of facets 30mf in the main plane 30m.

In the step of growing the additional group III nitride crystal 30, as in the growth of the group III nitride crystal 20, the group III nitride crystal 30 having at least one of the following impurity atom concentrations is preferably grown: an oxygen atom concentration of $1 \times 10^{16}$ cm$^{-3}$ or more and $4 \times 10^{19}$ cm$^{-3}$ or less, a silicon atom concentration of $6 \times 10^{14}$ cm$^{-3}$ or more and $5 \times 10^{18}$ cm$^{-3}$ or less, a hydrogen atom concentration of $6 \times 10^{16}$ cm$^{-3}$ or more and $1 \times 10^{18}$ cm$^{-3}$ or less, and a carbon atom concentration of $1 \times 10^{16}$ cm$^{-3}$ or more and $1 \times 10^{18}$ cm$^{-3}$ or less.

From the perspective described above, with respect to the impurity atom concentration of the group III nitride crystal 30, the oxygen atom concentration is more preferably $5 \times 10^{16}$ cm$^{-3}$ or more and $1 \times 10^{19}$ cm$^{-3}$ or less, still more preferably $1 \times 10^{17}$ cm$^{-3}$ or more and $8 \times 10^{18}$ cm$^{-3}$ or less. The silicon atom concentration is more preferably $1 \times 10^{15}$ cm$^{-3}$ or more and $3 \times 10^{18}$ cm$^{-3}$ or less, still more preferably $1 \times 10^{16}$ cm$^{-3}$ or more and $1 \times 10^{18}$ cm$^{-3}$ or less. The hydrogen atom concentration is more preferably $1 \times 10^{17}$ cm$^{-3}$ or more and $9 \times 10^{17}$ cm$^{-3}$ or less, still more preferably $2 \times 10^{17}$ cm$^{-3}$ or more and $7 \times 10^{17}$ cm$^{-3}$ or less. The carbon atom concentration is more preferably $5 \times 10^{16}$ cm$^{-3}$ or more and $9 \times 10^{17}$ cm$^{-3}$ or less, still more preferably $9 \times 10^{16}$ cm$^{-3}$ or more and $7 \times 10^{17}$ cm$^{-3}$ or less. More preferably two, still more preferably three, most preferably four, of the impurity atom concentrations described above (the oxygen atom concentration, the silicon atom concentration, the hydrogen atom concentration, and the carbon atom concentration) satisfy the predetermined concentrations.

In a method for growing an additional group III nitride crystal, a method for adding an impurity atom to the additional group III nitride crystal 30 and a method for preventing the contamination of the additional group III nitride crystal 30 with an impurity atom are not particularly limited. The methods described for the growth of the group III nitride crystal 20 can be used.

In the growth of an additional group III nitride crystal, a region-on-substrate 30s of the additional group III nitride crystal 30 can be formed on the region-on-substrate 20s of the additional group III nitride crystal substrate 20p, and a region-on-substrate-interface 30t of the additional group III nitride crystal 30 can be formed on the region-on-substrate-interface 20t of the additional group III nitride crystal substrate 20p.

(Second Embodiment)

With reference to FIGS. 1 to 4, a group III nitride crystal according to another embodiment of the present invention is group III nitride crystals 20 and 30 having a main plane with a crystal-geometrically equivalent plane orientation selected from the group consisting of {20-21}, {20-2-1}, {22-41}, and {22-4-1}. The group III nitride crystals 20 and 30 have at least one of the following impurity atom concentrations: an oxygen atom concentration of $1 \times 10^{16}$ cm$^{-3}$ or more and $4 \times 10^{19}$ cm$^{-3}$ or less, a silicon atom concentration of $6 \times 10^{14}$ cm$^{-3}$ or more and $5 \times 10^{18}$ cm$^{-3}$ or less, a hydrogen atom concentration of $6 \times 10^{16}$ cm$^{-3}$ or more and $1 \times 10^{18}$ cm$^{-3}$ or less, and a carbon atom concentration of $1 \times 10^{16}$ cm$^{-3}$ or more and $1 \times 10^{18}$ cm$^{-3}$ or less.

The group III nitride crystals 20 and 30 according to the present embodiment have main planes 20m and 30m with a crystal-geometrically equivalent plane orientation selected from the group consisting of {20-21}, {20-2-1}, {22-41}, and {22-4-1}. In a light emitting device in which a light-emitting layer having a multi-quantum well (MQW) structure is formed on the main planes 20m and 30m of the group III nitride crystals 20 and 30 serving as a substrate, therefore, spontaneous polarization in the light-emitting layer is prevented. This reduces a decrease in luminous efficiency. The group III nitride crystals according to the present embodiment have at least one of the following impurity concentrations: an oxygen atom concentration of $1 \times 10^{16}$ cm$^{-3}$ or more and $4 \times 10^{19}$ cm$^{-3}$ or less, a silicon atom concentration of $6 \times 10^{14}$ cm$^{-3}$ or more and $5 \times 10^{18}$ cm$^{-3}$ or less, a hydrogen atom concentration of $6 \times 10^{16}$ cm$^{-3}$ or more and $1 \times 10^{18}$ cm$^{-3}$ or less, and a carbon atom concentration of $1 \times 10^{16}$ cm$^{-3}$ or more and $1 \times 10^{18}$ cm$^{-3}$ or less. Thus, the group III nitride crystals according to the present embodiment have high crystallinity due to a reduced formation of planar defects in the {0001} plane.

The group III nitride crystals 20 and 30 according to the present embodiment have the main planes 20m and 30m preferably having an area of 10 cm$^2$ or more, more preferably 18 cm$^2$ or more, still more preferably 40 cm$^2$ or more. The group III nitride crystals thus obtained have a large size and high crystallinity.

EXAMPLES

[Preparation of Group III Nitride Bulk Crystal]

Figure 5A:
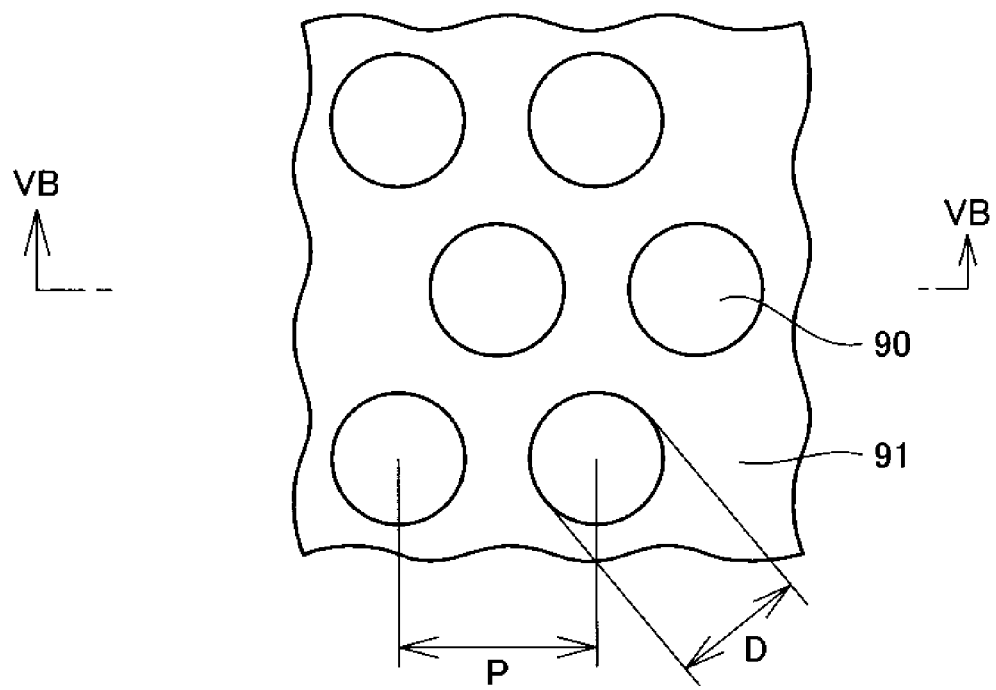
FIG. 5A is a schematic plan view.
Figure 5B:
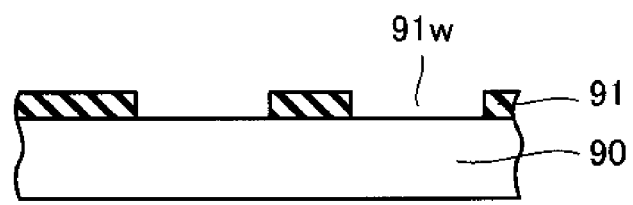
FIG. 5B is a schematic cross-sectional view taken along the line VB-VB of FIG. 5A.

A GaN bulk crystal, which is a group III nitride bulk crystal for use in a method for producing a group III nitride crystal according to the present invention, was produced by the following method, with reference to FIG. 5.

First, a SiO$_2$ layer having a thickness of 100 nm was formed as a mask layer 91 on a base substrate 90 by sputtering. The base substrate 90 was a GaAs substrate having a (111)A plane as a main plane and had a diameter of 50 mm and a thickness of 0.8 mm. As illustrated in FIGS. 5A and B, a pattern was then formed by a photolithography method and etching. In the pattern, windows 91w having a diameter D of 2 µm were hexagonally close-packed at intervals P of 4 µm. The GaAs substrate (the base substrate 90) was exposed from the windows 91w.

A GaN bulk crystal, which is a group III nitride bulk crystal, was grown on the GaAs substrate (the base substrate 90), on which the mask layer 91 having a plurality of windows 91w was formed, by a HVPE method. More specifically, a GaN low-temperature layer having a thickness of 80 nm was grown at 500° C. on the GaAs substrate by the HVPE method. A GaN intermediate layer having a thickness of 60 µm was then grown at 950° C. A GaN bulk crystal having a thickness of 5 mm was then grown at 1050° C.

The GaAs substrate was then removed from the GaN bulk crystal by etching using aqua regia to form a GaN bulk crystal having a diameter of 50 mm and a thickness of 3 mm, which is a group III nitride bulk crystal.

Example 1

First, with reference to FIG. 1A, both main planes, a (0001) plane and a (000-1) plane, of a GaN bulk crystal (a group III nitride bulk crystal 1) were ground and polished to an average roughness Ra of 5 nm. The average surface roughness Ra was determined with AFM.

With reference to FIG. 1A, the GaN bulk crystal (the group III nitride bulk crystal 1) in which the average roughness Ra of each of the main planes was 5 nm was cut perpendicularly to the <20-21> direction into a plurality of GaN crystal substrates (group III nitride crystal substrates 10p and 10q). The GaN crystal substrates had a width S of 3.1 mm, a length L in the range of 20 to 50 mm, and a thickness T of 1 mm and had a {20-21} main plane. The four planes of each of the GaN crystal substrates not yet subjected to grinding and polishing were ground and polished to an average roughness Ra of 5 nm. Thus, a plurality of GaN crystal substrates were prepared in which the average roughness Ra of the {20-21} main plane was 5 nm. In some of the GaN crystal substrates, the plane orientation of the main plane did not precisely coincide with {20-21}. In all such GaN crystal substrates, however, the plane orientation of the main plane had an off-angle of five degrees or less with respect to {20-21}. The off-angle was determined by an X-ray diffraction method.

Figure 1B:
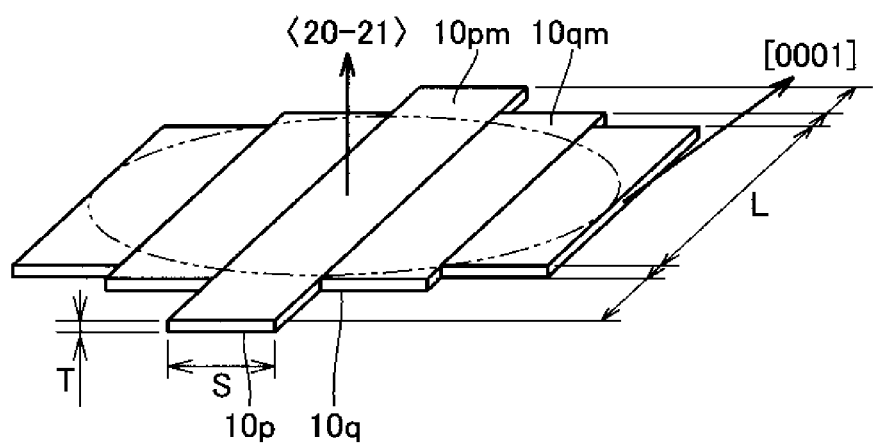
FIG. 1B illustrates the step of arranging the group III nitride crystal substrates.

With reference to FIG. 1B, the plurality of GaN crystal substrates were transversely arranged adjacent to each other in a quartz crystal growth container such that (20-21) main planes 10pm and 10qm of the GaN crystal substrates (the group III nitride crystal substrates 10p and 10q) were parallel to each other and each [0001] direction of the GaN crystal substrates (the group III nitride crystal substrates 10p and 10q) coincided with each other. Also with reference to FIG. 1C, each of contact surfaces 10pt and 10qt of the plurality of GaN crystal substrates (the group III nitride crystal substrates 10p and 10q) had an average roughness Ra of 5 nm. A circle inscribed in the plurality of GaN crystal substrates (the group III nitride crystal substrates 10p and 10q) thus arranged had a diameter of 50 mm.

Figure 1C:
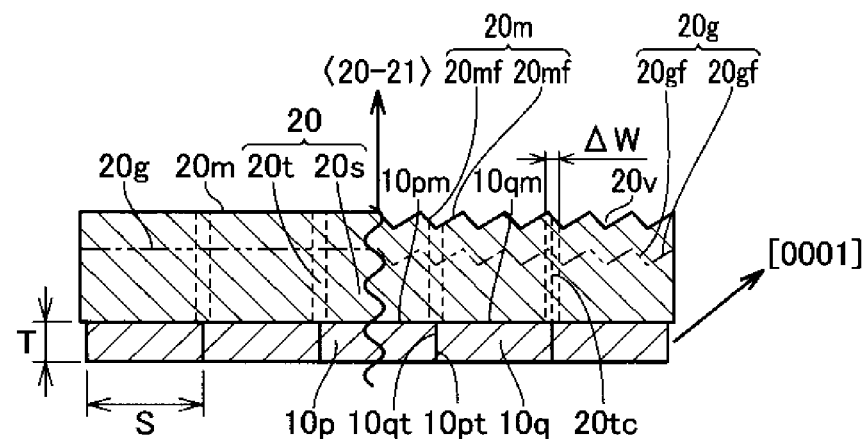
FIG. 1C illustrates the step of growing a group III nitride crystal.
Figure 1D:
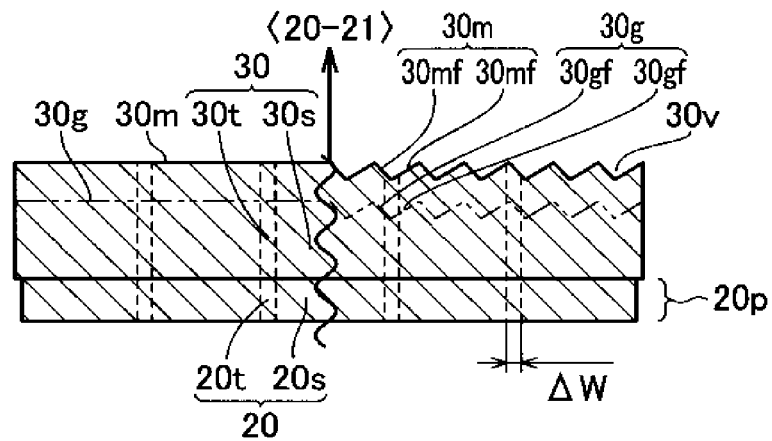
FIG. 1D illustrates the step of growing an additional group III nitride crystal.

With reference to FIG. 1C, the (20-21) main planes 10pm and 10qm of the plurality of GaN crystal substrates (the group III nitride crystal substrates 10p and 10q) arranged in the quartz crystal growth container were treated at 800° C. for two hours in a mixed gas atmosphere of 10% by volume hydrogen chloride gas and 90% by volume nitrogen gas. A GaN crystal (a group III nitride crystal 20) was then grown on the main planes 10pm and 10qm by a HVPE method at a crystal growth temperature of 1020° C. for 40 hours.

The GaN crystal (the group III nitride crystal 20) had a thickness of 2.4 mm, as determined by a contact thickness gauge (Digimatic Indicator manufactured by Mitutoyo Co.). Thus, the crystal growth rate was 60 µm/h. With reference to the left side of the central portion in FIG. 1C, the GaN crystal (the group III nitride crystal 20) had no abnormal crystal growth in a region-on-substrate-interface 20t and a region-on-substrate 20s and had a flat (20-21) main plane 20m. The crystallinity of the GaN crystal (the group III nitride crystal 20) was determined by the X-ray rocking curve measurement of the (20-21) plane. In the region-on-substrate 20s of the GaN crystal, an unsplit diffraction peak having a full width at half maximum of 100 arcsec was observed. In the region-on-substrate-interface 20t having a width ΔW of 300 µm, a split diffraction peak having a full width at half maximum of 300 arcsec was observed.

The (20-21) main plane 20m of the GaN crystal had a threading dislocation density of 1×10$^7$ cm$^{-2}$ in the region-on-substrate 20s and 3×10$^7$ cm$^{-2}$ in the region-on-substrate-interface 20t, as determined by cathodoluminescence (hereinafter referred to as CL). The planar defect density in the {0001} plane of the GaN crystal was determined to be 8.3 cm$^{-1}$ by cathodoluminescence (CL) of a cross section of the GaN crystal perpendicular to the <1-210> direction. The GaN crystal had a carrier concentration of 5×10$^{18}$ cm$^{-3}$ as calculated from the Hall measurement. The concentrations of the main impurity atoms of the GaN crystal were measured by secondary ion mass spectrometry (SIMS)) as follows: the oxygen atom concentration [O] was 5×10$^{18}$ cm$^{-3}$, the silicon atom concentration [Si] was 1×10$^{18}$ cm$^{-3}$, the hydrogen atom concentration [H] was 4×10$^{16}$ cm$^{-3}$, and the carbon atom concentration [C] was 5×10$^{15}$ cm$^{-3}$. Table I summarizes the results.

Although all the plane orientations of the main planes of the plurality of GaN crystal substrates on which a GaN crystal was grown were (20-21) in Example 1, substantially the same results were obtained even in the case that at least part of the plane orientations were (−2201) (which is crystal-geometrically equivalent with (20-21)).

Example 2

Figure 2A:
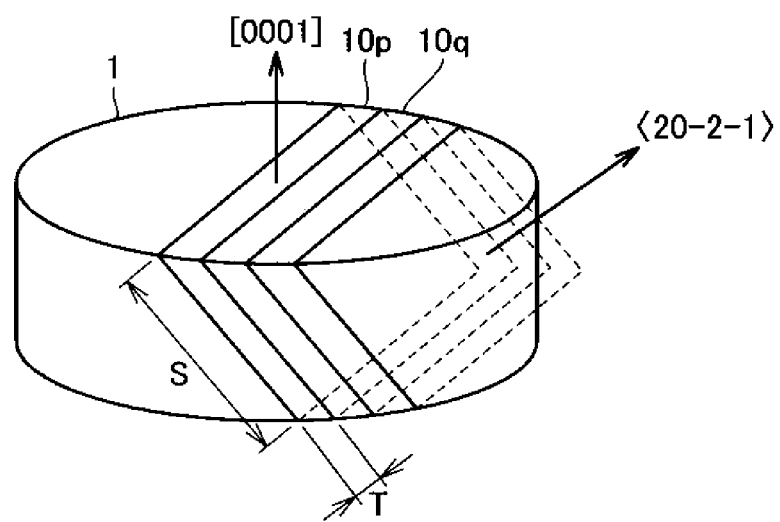
FIG. 2A illustrates the step of cutting group III nitride crystal substrates.

First, with reference to FIG. 2A, both main planes, a (0001) plane and a (000-1) plane, of a GaN bulk crystal (a group III nitride bulk crystal 1) were ground and polished to an average roughness Ra of 5 nm.

With reference to FIG. 2A, the GaN bulk crystal (the group III nitride bulk crystal 1) in which the average roughness Ra of each of the main planes was 5 nm was cut perpendicularly to the <20-2-1> direction into a plurality of GaN crystal substrates (group III nitride crystal substrates 10p and 10q). The GaN crystal substrates had a width S of 3.1 mm, a length L in the range of 20 to 50 mm, and a thickness T of 1 mm and had a {20-2-1} main plane. Four planes of each of the GaN crystal substrates not subjected to grinding and polishing were ground and polished to an average roughness Ra of 5 nm. Thus, a plurality of GaN crystal substrates were prepared in which the average roughness Ra of the {20-2-1} main plane was 5 nm. In some of the GaN crystal substrates, the plane orientation of the main plane did not precisely coincide with {20-2-1}. In all such GaN crystal substrates, however, the plane orientation of the main plane had an off-angle of five degrees or less with respect to {20-2-1}.

Figure 2B:
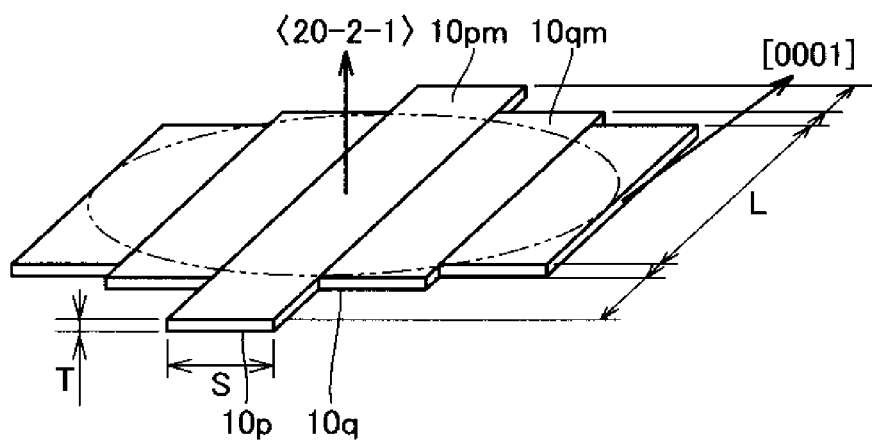
FIG. 2B illustrates the step of arranging the group III nitride crystal substrates.

With reference to FIG. 2B, the plurality of GaN crystal substrates were transversely arranged adjacent to each other in a quartz crystal growth container such that (20-2-1) main planes 10$pm$ and 10$qm$ of the GaN crystal substrates (the group III nitride crystal substrates 10$p$ and 10$q$) were parallel to each other and each [0001] direction of the GaN crystal substrates (the group III nitride crystal substrates 10$p$ and 10$q$) coincided with each other. Also with reference to FIG. 2C, each of contact surfaces 10$pt$ and 10$qt$ of the plurality of GaN crystal substrates (the group III nitride crystal substrates 10$p$ and 10$q$) had an average roughness Ra of 5 nm. A circle inscribed in the plurality of GaN crystal substrates (the group III nitride crystal substrates 10$p$ and 10$q$) thus arranged had a diameter of 50 mm.

Figure 2C:
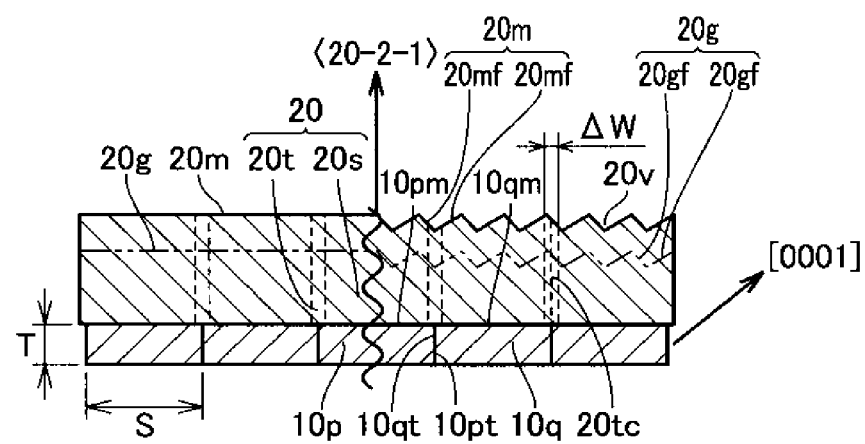
FIG. 2C illustrates the step of growing a group III nitride crystal.
Figure 2D:
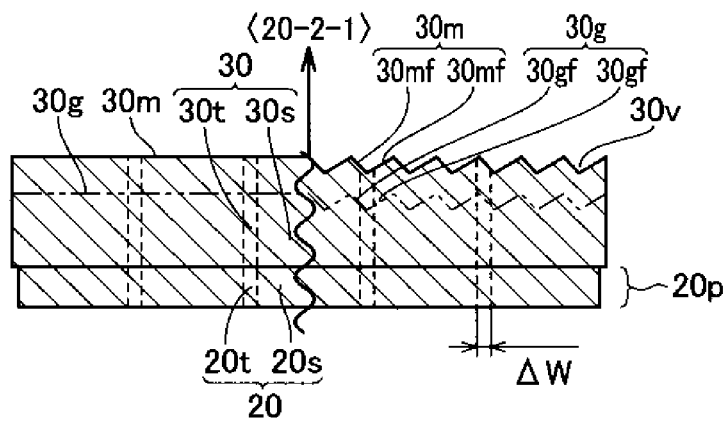
FIG. 2D illustrates the step of growing an additional group III nitride crystal.

With reference to FIG. 2C, the (20-2-1) main planes 10$pm$ and 10$qm$ of the plurality of GaN crystal substrates (the group III nitride crystal substrates 10$p$ and 10$q$) arranged in the quartz crystal growth container were treated in the same way as in Example 1. A GaN crystal (a group III nitride crystal 20) was then grown on the main planes 10$pm$ and 10$qm$ by the same growth method at the same growth temperature for the same growth time as in Example 1.

The GaN crystal (the group III nitride crystal 20) had a thickness of 3.2 mm, and the crystal growth rate was 80 μm/h. With reference to the left side of the central portion in FIG. 2C, the GaN crystal (the group III nitride crystal 20) had no abnormal crystal growth in a region-on-substrate-interface 20$t$ and a region-on-substrate 20$s$ and had a flat (20-2-1) main plane 20$m$. The crystallinity of the GaN crystal (the group III nitride crystal 20) was determined by the X-ray rocking curve measurement of the (20-2-1) plane. In the region-on-substrate 20$s$, an unsplit diffraction peak having a full width at half maximum of 90 arcsec was observed. Thus, this GaN crystal had better crystallinity than the GaN crystal having the (20-21) plane as the main plane. In the region-on-substrate-interface 20$t$ having a width ΔW of 100 μm, a split diffraction peak having a full width at half maximum of 360 arcsec was observed.

The (20-2-1) main plane 20$m$ of the GaN crystal had a threading dislocation density of $1\times10^7$ cm$^{-2}$ in the region-on-substrate 20$s$ and $4\times10^7$ cm$^{-2}$ in the region-on-substrate-interface 20$t$. The planar defect density in the {0001} plane of the GaN crystal was determined to be 6.1 cm$^{-1}$ by cathodoluminescence (CL) of a cross section of the GaN crystal perpendicular to the <1-210> direction. The GaN crystal had a carrier concentration of $1\times10^{18}$ cm$^{-3}$ as calculated from the Hall measurement. The concentrations of the main impurity atoms of the GaN crystal were measured by secondary ion mass spectrometry (SIMS)) as follows: the oxygen atom concentration [O] was $9\times10^{17}$ cm$^{-3}$, the silicon atom concentration [Si] was $1\times10^{18}$ cm$^{-3}$, the hydrogen atom concentration [H] was $4\times10^{16}$ cm$^{-3}$, and the carbon atom concentration [C] was $5\times10^{15}$ cm$^{-3}$. Table I summarizes the results.

Although all the plane orientations of the main planes of the plurality of GaN crystal substrates on which a GaN crystal was grown were (20-2-1) in Example 2, substantially the same results were obtained even in the case that at least part of the plane orientations were (–202-1) (which is crystal-geometrically equivalent with (20-2-1)).

The GaN crystal produced in Example 2 had a lower formation of cracks than the GaN crystal produced in Example 1.

Example 3

Figure 3A:
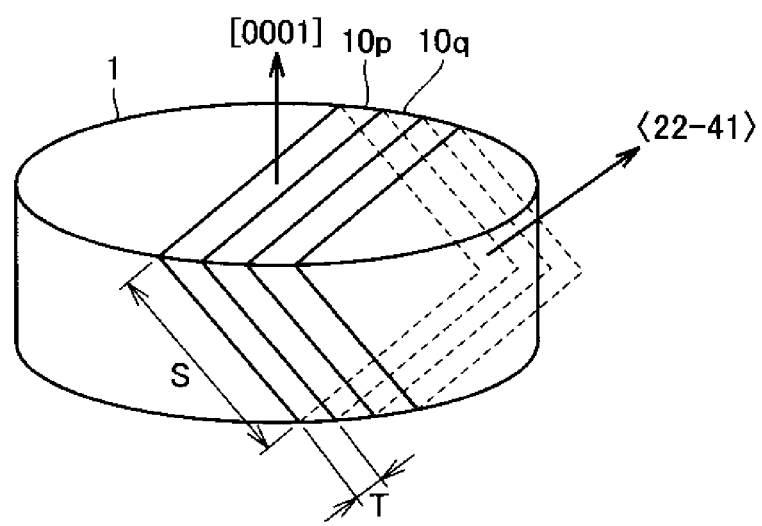
FIG. 3A illustrates the step of cutting group III nitride crystal substrates.

First, with reference to FIG. 3A, both main planes, a (0001) plane and a (000-1) plane, of the GaN bulk crystal (a group III nitride bulk crystal 1) were ground and polished to an average roughness Ra of 5 nm.

With reference to FIG. 3A, the GaN bulk crystal (the group III nitride bulk crystal 1) in which the average roughness Ra of each of the main planes was 5 nm was cut perpendicularly to the <22-41> direction into a plurality of GaN crystal substrates (group III nitride crystal substrates 10$p$ and 10$q$). The GaN crystal substrates had a width S of 3.2 mm, a length L in the range of 20 to 50 mm, and a thickness T of 1 mm and had a {22-41} main plane. Four planes of each of the GaN crystal substrates not subjected to grinding and polishing were ground and polished to an average roughness Ra of 5 nm. Thus, a plurality of GaN crystal substrates were prepared in which the average roughness Ra of the {22-41} main plane was 5 nm. In some of the GaN crystal substrates, the plane orientation of the main plane did not precisely coincide with {22-41}. In all such GaN crystal substrates, however, the plane orientation of the main plane had an off-angle of five degrees or less with respect to {22-41}.

Figure 3B:
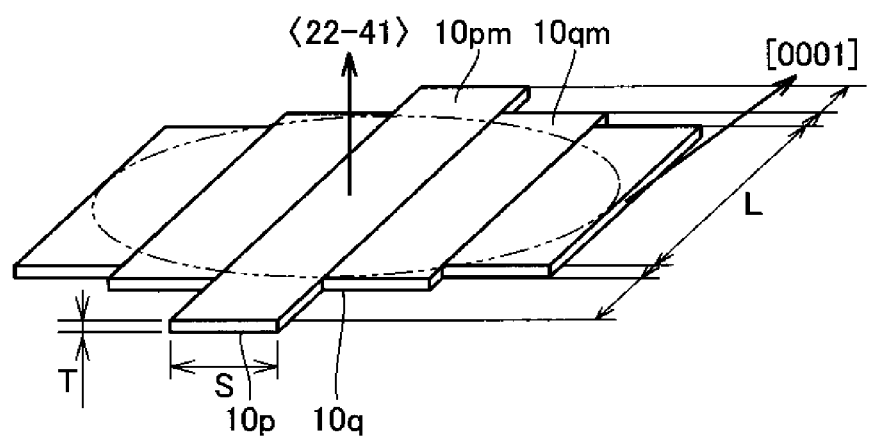
FIG. 3B illustrates the step of arranging the group III nitride crystal substrates.

With reference to FIG. 3B, the plurality of GaN crystal substrates were transversely arranged adjacent to each other in a quartz crystal growth container such that (22-41) main planes 10$pm$ and 10$qm$ of the GaN crystal substrates (the group III nitride crystal substrates 10$p$ and 10$q$) were parallel to each other and each [0001] direction of the GaN crystal substrates (the group III nitride crystal substrates 10$p$ and 10$q$) coincided with each other. Also with reference to FIG. 3C, each of contact surfaces 10$pt$ and 10$qt$ of the plurality of GaN crystal substrates (the group III nitride crystal substrates 10$p$ and 10$q$) had an average roughness Ra of 5 nm. A circle inscribed in the plurality of GaN crystal substrates (the group III nitride crystal substrates 10$p$ and 10$q$) thus arranged had a diameter of 50 mm.

Figure 3C:
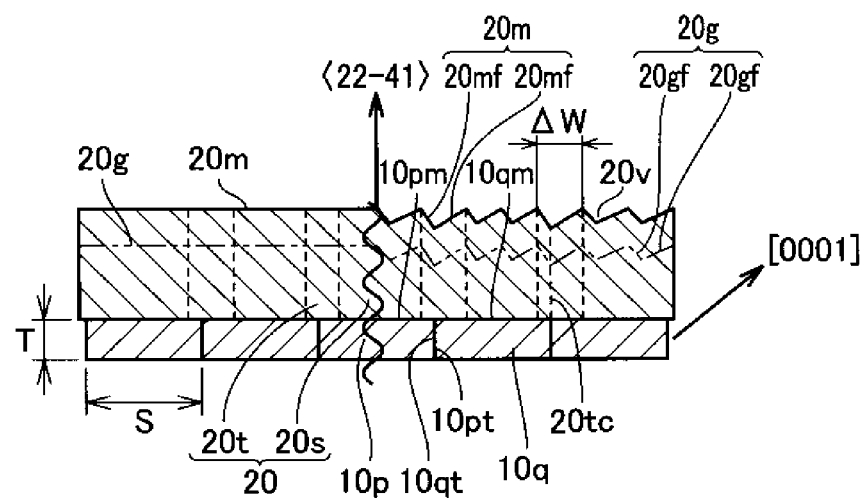
FIG. 3C illustrates the step of growing a group III nitride crystal.
Figure 3D:
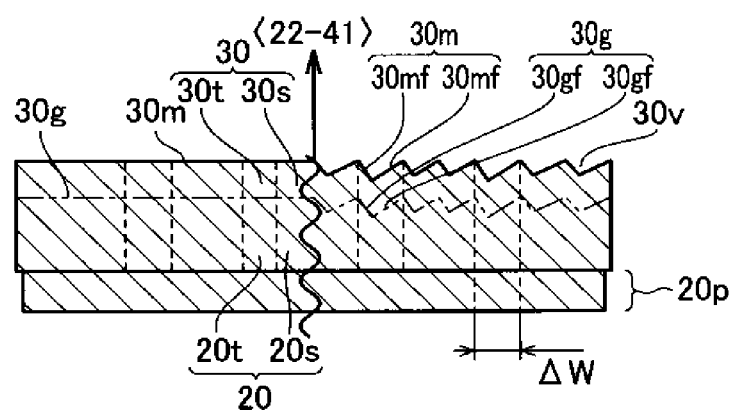
FIG. 3D illustrates the step of growing an additional group III nitride crystal.

With reference to FIG. 3C, the (22-41) main planes 10$pm$ and 10$qm$ of the plurality of GaN crystal substrates (the group III nitride crystal substrates 10$p$ and 10$q$) arranged in the quartz crystal growth container were treated in the same way as in Example 1. A GaN crystal (a group III nitride crystal 20) was then grown on the main planes 10$pm$ and 10$qm$ by the same growth method at the same growth temperature for the same growth time as in Example 1.

The GaN crystal (the group III nitride crystal 20) had a thickness of 3.0 mm, and the crystal growth rate was 75 μm/h. With reference to the right side of the central portion in FIG. 3C, the GaN crystal (the group III nitride crystal 20) had a (22-41) main plane 20$m$ in a region-on-substrate-interface 20$t$ and a region-on-substrate 20$s$. A plurality of facets 20$mf$ on the (22-41) main plane 20$m$ formed depressions 20$v$. The crystallinity of the GaN crystal (the group III nitride crystal 20) was determined by the X-ray rocking curve measurement of the (22-41) plane. In the region-on-substrate 20$s$, an unsplit diffraction peak having a full width at half maximum of 120 arcsec was observed. In the region-on-substrate-interface 20$t$ having a width ΔW of 300 μm, a split diffraction peak having a full width at half maximum of 220 arcsec was observed.

The (22-41) main plane 20$m$ of the GaN crystal had a threading dislocation density of $3\times10^7$ cm$^{-2}$ in the region-on-substrate 20$s$ and $7\times10^7$ cm$^{-2}$ in the region-on-substrate-interface 20$t$. The planar defect density in the {0001} plane of the GaN crystal was determined to be 8.6 cm$^{-1}$ by cathodoluminescence (CL) of a cross section of the GaN crystal perpendicular to the <10-10> direction. The GaN crystal had a carrier concentration of $2\times10^{18}$ cm$^{-3}$ as calculated from the Hall measurement. The concentrations of the main impurity atoms of the GaN crystal were measured by secondary ion mass spectrometry (SIMS)) as follows: the oxygen atom concentration [O] was $2\times10^{18}$ cm$^{-3}$, the silicon atom concentration [Si] was $9\times10^{17}$ cm$^{-3}$, the hydrogen atom concentration [H] was $4\times10^{16}$ cm$^{-3}$, and the carbon atom concentration [C] was $5\times10^{15}$ cm$^{-3}$. Table I summarizes the results.

Although all the plane orientations of the main planes of the plurality of GaN crystal substrates on which a GaN crystal was grown were (22-41) in Example 3, substantially the same results were obtained even in the case that at least part of the plane orientations were (−4221) (which is crystal-geometrically equivalent with (22-41)).

Example 4

Figure 4A:
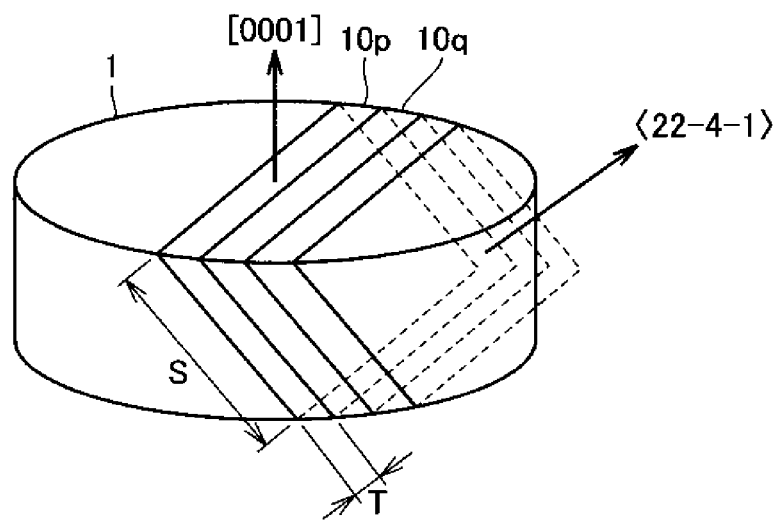
FIG. 4A illustrates the step of cutting group III nitride crystal substrates.

First, with reference to FIG. 4A, both main planes, a (0001) plane and a (000-1) plane, of the GaN bulk crystal (a group III nitride bulk crystal 1) were ground and polished to an average roughness Ra of 5 nm.

With reference to FIG. 4A, the GaN bulk crystal (the group III nitride bulk crystal 1) in which the average roughness Ra of each of the main planes was 5 nm was cut perpendicularly to the <22-4-1> direction into a plurality of GaN crystal substrates (group III nitride crystal substrates 10p and 10q). The GaN crystal substrates had a width S of 3.2 mm, a length L in the range of 20 to 50 mm, and a thickness T of 1 mm and had a {22-4-1} main plane. Four planes of each of the GaN crystal substrates not subjected to grinding and polishing were ground and polished to an average roughness Ra of 5 nm. Thus, a plurality of GaN crystal substrates were prepared in which the average roughness Ra of the {22-4-1} main plane was 5 nm. In some of the GaN crystal substrates, the plane orientation of the main plane did not precisely coincide with {22-4-1}. In all such GaN crystal substrates, however, the plane orientation of the main plane had an off-angle of five degrees or less with respect to {22-4-1}.

Figure 4B:
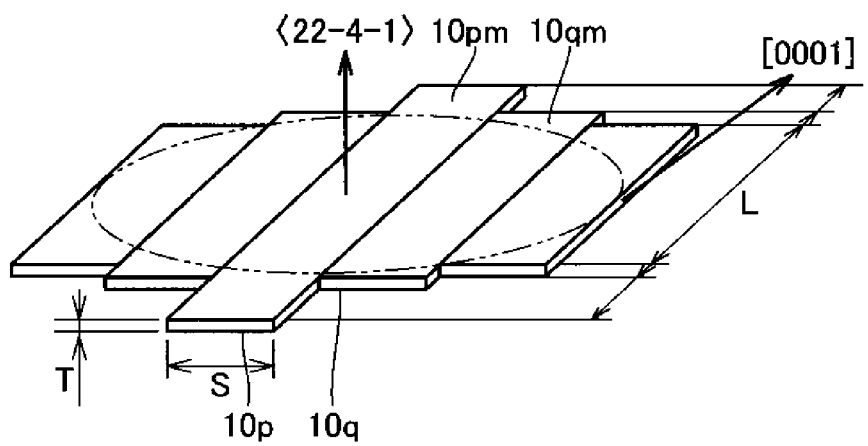
FIG. 4B illustrates the step of arranging the group III nitride crystal substrates.

With reference to FIG. 4B, the plurality of GaN crystal substrates were transversely arranged adjacent to each other in a quartz crystal growth container such that (22-4-1) main planes 10pm and 10qm of the GaN crystal substrates (the group III nitride crystal substrates 10p and 10q) were parallel to each other and each [0001] direction of the GaN crystal substrates (the group III nitride crystal substrates 10p and 10q) coincided with each other. Also with reference to FIG. 4C, each of contact surfaces 10pt and 10qt of the plurality of GaN crystal substrates (the group III nitride crystal substrates 10p and 10q) had an average roughness Ra of 5 nm. A circle inscribed in the plurality of GaN crystal substrates (the group III nitride crystal substrates 10p and 10q) thus arranged had a diameter of 50 mm.

Figure 4C:
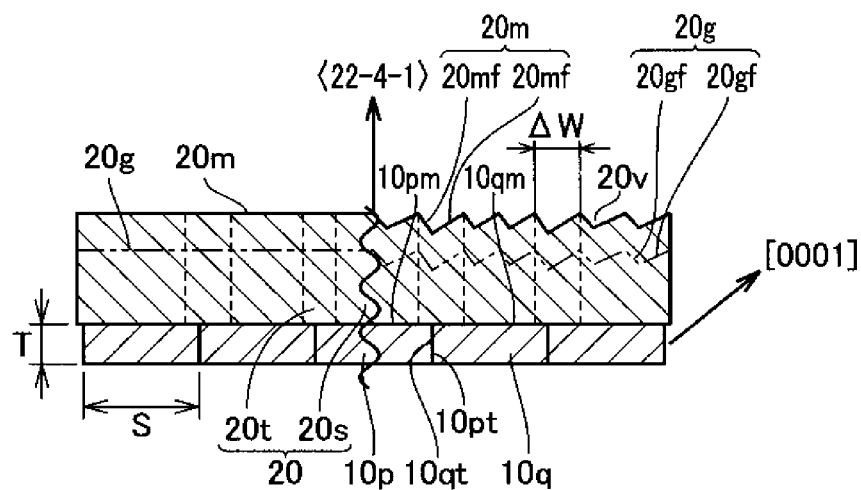
FIG. 4C illustrates the step of growing a group III nitride crystal.
Figure 4D:
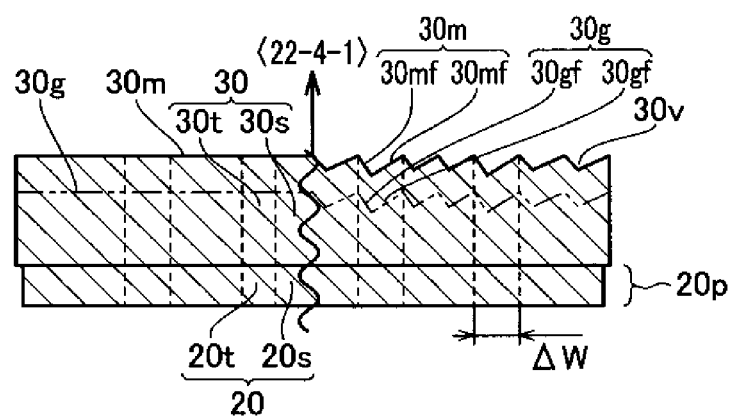
FIG. 4D illustrates the step of growing an additional group III nitride crystal.

With reference to FIG. 4C, the (22-4-1) main planes 10pm and 10qm of the plurality of GaN crystal substrates (the group III nitride crystal substrates 10p and 10q) arranged in the quartz crystal growth container were treated in the same way as in Example 1. A GaN crystal (a group III nitride crystal 20) was then grown on the main planes 10pm and 10qm by the same growth method at the same growth temperature for the same growth time as in Example 1.

The GaN crystal (the group III nitride crystal 20) had a thickness of 4.0 mm, and the crystal growth rate was 100 μm/h. With reference to the right side of the central portion in FIG. 4C, the GaN crystal (the group III nitride crystal 20) had a (22-4-1) main plane 20m in a region-on-substrate-interface 20t and a region-on-substrate 20s. A plurality of facets 20mf on the (22-4-1) main plane 20m formed depressions 20v. The crystallinity of the GaN crystal (the group III nitride crystal 20) was determined by the X-ray rocking curve measurement of the (22-4-1) plane. In the region-on-substrate 20s, an unsplit diffraction peak having a full width at half maximum of 140 arcsec was observed. In the region-on-substrate-interface 20t having a width ΔW of 500 μm, a split diffraction peak having a full width at half maximum of 200 arcsec was observed.

The (22-4-1) main plane 20m of the GaN crystal had a threading dislocation density of $3\times10^7$ cm$^{-2}$ in the region-on-substrate 20s and $7\times10^7$ cm$^{-2}$ in the region-on-substrate-interface 20t. The planar defect density in the {0001} plane of the GaN crystal was determined to be 7.9 cm$^{-1}$ by cathodoluminescence (CL) of a cross section of the GaN crystal perpendicular to the <10-10> direction. The GaN crystal had a carrier concentration of $2\times10^{18}$ cm$^{-3}$ as calculated from the Hall measurement. The concentrations of the main impurity atoms of the GaN crystal were measured by secondary ion mass spectrometry (SIMS)) as follows: the oxygen atom concentration [O] was $2\times10^{18}$ cm$^{-3}$, the silicon atom concentration [Si] was $9\times10^{17}$ cm$^{-3}$, the hydrogen atom concentration [H] was $4\times10^{16}$ cm$^{-3}$, and the carbon atom concentration [C] was $5\times10^{15}$ cm$^{-3}$. Table I summarizes the results.

Although all the plane orientations of the main planes of the plurality of GaN crystal substrates on which a GaN crystal was grown were (22-4-1) in Example 4, substantially the same results were obtained even in the case that at least part of the plane orientations were (−422-1) (which is crystal-geometrically equivalent with (22-4-1)).

TABLE I

| | | | Example 1 | Example 2 | Example 3 | Example 4 |
|---|---|---|---|---|---|---|
| Group III nitride crystal substrate | Type of substrate | | GaN | GaN | GaN | GaN |
| | Plane orientation of main plane | | (20-21) | (20-2-1) | (22-41) | (22-4-1) |
| | Surface roughness Ra of main plane (mm) | | 5 | 5 | 5 | 5 |
| | Surface roughness Ra of adjacent plane (mm) | | 5 | 5 | 5 | 5 |
| Group III nitride crystal | Type of crystal | | GaN | GaN | GaN | GaN |
| | Crystal growth method | | HVPE | HVPE | HVPE | HVPE |
| | Crystal growth temperature (° C.) | | 1020 | 1020 | 1020 | 1020 |
| | Crystal growth rate (μm/hr) | | 60 | 80 | 75 | 100 |
| | Plane orientation of main plane | | (20-21) | (20-2-1) | (22-41) | (22-4-1) |
| | Presence of depression in main plane | | No | No | Yes | Yes |
| | Full width at half maximum of X-ray diffraction peak (arcsec) | Region-on-substrate | 100 | 90 | 120 | 140 |
| | | Region-on-substrate-interface | 300 | 360 | 220 | 200 |
| | Threading dislocation density of main plane (cm$^{-2}$) | Region-on-substrate | $1\times10^7$ | $1\times10^7$ | $3\times10^7$ | $3\times10^7$ |
| | | Region-on-substrate-interface | $3\times10^7$ | $4\times10^7$ | $7\times10^7$ | $7\times10^7$ |
| | Planar defect density (cm$^{-1}$) | | 8.3 | 6.1 | 8.6 | 7.9 |

TABLE I-continued

|  |  | Example 1 | Example 2 | Example 3 | Example 4 |
|---|---|---|---|---|---|
| Carrier concentration ($cm^{-3}$) | | $5 \times 10^{18}$ | $1 \times 10^{18}$ | $2 \times 10^{18}$ | $2 \times 10^{18}$ |
| Main impurity atoms | [O] ($cm^{-3}$) | $5 \times 10^{18}$ | $9 \times 10^{17}$ | $2 \times 10^{18}$ | $2 \times 10^{18}$ |
| | [Si] ($cm^{-3}$) | $1 \times 10^{18}$ | $1 \times 10^{18}$ | $9 \times 10^{17}$ | $9 \times 10^{17}$ |
| | [H] ($cm^{-3}$) | $4 \times 10^{16}$ | $4 \times 10^{16}$ | $4 \times 10^{16}$ | $4 \times 10^{16}$ |
| | [C] ($cm^{-3}$) | $5 \times 10^{15}$ | $5 \times 10^{15}$ | $5 \times 10^{15}$ | $5 \times 10^{15}$ |

As is clear from Table I, a high-crystallinity group III nitride crystal having a main plane with a plane orientation other than {0001} can be grown at a high crystal growth rate by growing the group III nitride crystal on a plurality of group III nitride crystal substrates 10p having the main planes 10pm and 10qm with a plane orientation with an off-angle of five degrees or less with respect to a crystal-geometrically equivalent plane orientation selected from the group consisting of {20-21}, {20-2-1}, {22-41}, and {22-4-1}.

Comparative Example 1

A plurality of GaN crystal substrates (group III nitride crystal substrates) in which a {1-100} main plane had an average roughness Ra of 5 nm were produced in the same way as in Example 1 except that the GaN bulk crystal (group III nitride bulk crystal) was cut along a plurality of planes perpendicular to the <1-100> direction. In some of the GaN crystal substrates, the plane orientation of the main plane did not precisely coincide with {1-100}. In all such GaN crystal substrates, however, the plane orientation of the main plane had an off-angle of five degrees or less with respect to {1-100}. The off-angle was determined by an X-ray diffraction method.

The plurality of GaN crystal substrates were transversely arranged adjacent to each other in a quartz crystal growth container such that (1-100) main planes of the GaN crystal substrates (group III nitride crystal substrates) were parallel to each other and each [0001] direction of the GaN crystal substrates (group III nitride crystal substrates) coincided with each other. Each of the contact surfaces of the plurality of GaN crystal substrates (group III nitride crystal substrates) had an average roughness Ra of 5 nm. A circle inscribed in the plurality of GaN crystal substrates (the group III nitride crystal substrates 10p and 10q) thus arranged had a diameter of 50 mm.

The (1-100) main planes of the plurality of GaN crystal substrates (group III nitride crystal substrates) arranged in the quartz crystal growth container were treated in the same way as in Example 1. A GaN crystal (group III nitride crystal) was then grown on the main planes by the same growth method at the same growth temperature for the same growth time as in Example 1.

The GaN crystal (group III nitride crystal) had a thickness of 0.8 mm, and the crystal growth rate was 20 µm/h. The GaN crystal (group III nitride crystal) had no abnormal crystal growth also in the region-on-substrate-interface 20t and had a (1-100) main plane. The crystallinity of the GaN crystal (group III nitride crystal) was determined by the X-ray rocking curve measurement of the (1-100) plane. In the region-on-substrate of the GaN crystal, an unsplit diffraction peak having a full width at half maximum of 100 arcsec was observed. In the region-on-substrate-interface having a width ΔW of 300 µm, a split diffraction peak having a full width at half maximum of 300 arcsec was observed.

The (1-100) main plane of the GaN crystal had a threading dislocation density of $1 \times 10^7$ $cm^{-2}$ in the region-on-substrate and $3 \times 10^7$ $cm^{-2}$ in the region-on-substrate-interface. The GaN crystal had a carrier concentration of $5 \times 10^{18}$ $cm^{-3}$. The main impurity atoms of the GaN crystal were oxygen (O) atoms and silicon (Si) atoms. Table II summarizes the results.

Although all the plane orientations of the main planes of the plurality of GaN crystal substrates on which a GaN crystal was grown were (1-100) in Comparative Example 1, substantially the same results were obtained even in the case that at least part of the plane orientations were (−1100) (which is crystal-geometrically equivalent with (1-100)).

Comparative Example 2

A plurality of GaN crystal substrates (group III nitride crystal substrates) in which a {11-20} main plane had an average roughness Ra of 5 nm were produced in the same way as in Example 1 except that the GaN bulk crystal (group III nitride bulk crystal) was cut along a plurality of planes perpendicular to the <11-20> direction. In some of the GaN crystal substrates, the plane orientation of the main plane did not precisely coincide with {11-20}. In all such GaN crystal substrates, however, the plane orientation of the main plane had an off-angle of five degrees or less with respect to {11-20}. The off-angle was determined by an X-ray diffraction method.

The plurality of GaN crystal substrates were transversely arranged adjacent to each other in a quartz crystal growth container such that (11-20) main planes of the GaN crystal substrates (group III nitride crystal substrates) were parallel to each other and each [0001] direction of the GaN crystal substrates (group III nitride crystal substrates) coincided with each other. Each of the contact surfaces of the plurality of GaN crystal substrates (group III nitride crystal substrates) had an average roughness Ra of 5 nm. A circle inscribed in the plurality of GaN crystal substrates (the group III nitride crystal substrates 10p and 10q) thus arranged had a diameter of 50 mm.

The (11-20) main planes of the plurality of GaN crystal substrates (group III nitride crystal substrates) arranged in the quartz crystal growth container were treated in the same way as in Example 1. A GaN crystal (group III nitride crystal) was then grown on the main planes by the same growth method at the same growth temperature for the same growth time as in Example 1.

The GaN crystal (group III nitride crystal) had a thickness of 0.8 mm, and the crystal growth rate was 20 µm/h. The GaN crystal (group III nitride crystal) had no abnormal crystal growth also in the region-on-substrate-interface 20t and had a (11-20) main plane. The crystallinity of the GaN crystal (the group III nitride crystal) was determined by the X-ray rocking curve measurement of the (11-20) plane. In the region-on-substrate of the GaN crystal, an unsplit diffraction peak having a full width at half maximum of 250 arcsec was observed. In the region-on-substrate-interface having a width ΔW of 300 µm, a split diffraction peak having a full width at half maximum of 620 arcsec was observed.

The (11-20) main plane of the GaN crystal had a threading dislocation density of $1\times10^7$ cm$^{-2}$ in the region-on-substrate and $8\times10^7$ cm$^{-2}$ in the region-on-substrate-interface. The GaN crystal had a carrier concentration of $5\times10^{18}$ cm$^{-3}$. The main impurity atoms of the GaN crystal were oxygen (O) atoms and silicon (Si) atoms. Table II summarizes the results.

Although all the plane orientations of the main planes of the plurality of GaN crystal substrates on which a GaN crystal was grown were (11-20) in Comparative Example 2, substantially the same results were obtained even in the case that at least part of the plane orientations were (-1-120) (which is crystal-geometrically equivalent with (11-20)).

Comparative Example 3

A plurality of GaN crystal substrates (group III nitride crystal substrates) in which a {1-102} main plane had an average roughness Ra of 5 nm were produced in the same way as in Example 1 except that the GaN bulk crystal (group III nitride bulk crystal) was cut along a plurality of planes perpendicular to the <1-102> direction. In some of the GaN crystal substrates, the plane orientation of the main plane did not precisely coincide with {1-102}. In all such GaN crystal substrates, however, the plane orientation of the main plane had an off-angle of five degrees or less with respect to {1-102}. The off-angle was determined by an X-ray diffraction method.

The plurality of GaN crystal substrates were transversely arranged adjacent to each other in a quartz crystal growth container such that (1-102) main planes of the GaN crystal substrates (group III nitride crystal substrates) were parallel to each other and each [0001] direction of the GaN crystal substrates (group III nitride crystal substrates) coincided with each other. Each of the contact surfaces of the plurality of GaN crystal substrates (group III nitride crystal substrates) had an average roughness Ra of 5 nm. A circle inscribed in the plurality of GaN crystal substrates (the group III nitride crystal substrates 10$p$ and 10$q$) thus arranged had a diameter of 50 mm.

The (1-102) main planes of the plurality of GaN crystal substrates (group III nitride crystal substrates) arranged in the quartz crystal growth container were treated in the same way as in Example 1. A GaN crystal (group III nitride crystal) was then grown on the main planes by the same growth method at the same growth temperature for the same growth time as in Example 1.

The GaN crystal (group III nitride crystal) had a thickness of 0.8 mm, and the crystal growth rate was 20 µm/h. The GaN crystal (group III nitride crystal) had no abnormal crystal growth also in the region-on-substrate-interface 20$t$ and had a (1-102) main plane. The crystallinity of the GaN crystal (the group III nitride crystal) was determined by the X-ray rocking curve measurement of the (1-102) plane. In the region-on-substrate of the GaN crystal, an unsplit diffraction peak having a full width at half maximum of 120 arcsec was observed. In the region-on-substrate-interface having a width ΔW of 300 µm, a split diffraction peak having a full width at half maximum of 480 arcsec was observed.

The (1-102) main plane of the GaN crystal had a threading dislocation density of $1\times10^7$ cm$^{-2}$ in the region-on-substrate and $6\times10^7$ cm$^{-2}$ in the region-on-substrate-interface. The GaN crystal had a carrier concentration of $5\times10^{18}$ cm$^{-3}$. The main impurity atoms of the GaN crystal were oxygen (O) atoms and silicon (Si) atoms. Table II summarizes the results.

Although all the plane orientations of the main planes of the plurality of GaN crystal substrates on which a GaN crystal was grown were (1-102) in Comparative Example 3, substantially the same results were obtained even in the case that at least part of the plane orientations were (-1102) (which is crystal-geometrically equivalent with (1-102)).

Comparative Example 4

A plurality of GaN crystal substrates (group III nitride crystal substrates) in which a {11-22} main plane had an average roughness Ra of 5 nm were produced in the same way as in Example 1 except that the GaN bulk crystal (group III nitride bulk crystal) was cut along a plurality of planes perpendicular to the <11-22> direction. In some of the GaN crystal substrates, the plane orientation of the main plane did not precisely coincide with {11-22}. In all such GaN crystal substrates, however, the plane orientation of the main plane had an off-angle of five degrees or less with respect to {11-22}. The off-angle was determined by an X-ray diffraction method.

The plurality of GaN crystal substrates were transversely arranged adjacent to each other in a quartz crystal growth container such that (11-22) main planes of the GaN crystal substrates (group III nitride crystal substrates) were parallel to each other and each [0001] direction of the GaN crystal substrates (group III nitride crystal substrates) coincided with each other. Each of the contact surfaces of the plurality of GaN crystal substrates (group III nitride crystal substrates) had an average roughness Ra of 5 nm. A circle inscribed in the plurality of GaN crystal substrates (the group III nitride crystal substrates 10$p$ and 10$q$) thus arranged had a diameter of 50 mm.

The (11-22) main planes of the plurality of GaN crystal substrates (group III nitride crystal substrates) arranged in the quartz crystal growth container were treated in the same way as in Example 1. A GaN crystal (group III nitride crystal) was then grown on the main planes by the same growth method at the same growth temperature for the same growth time as in Example 1.

The GaN crystal (group III nitride crystal) had a thickness of 0.8 mm, and the crystal growth rate was 20 µm/h. The GaN crystal (group III nitride crystal) had no abnormal crystal growth also in the region-on-substrate-interface 20$t$ and had a (11-22) main plane. The crystallinity of the GaN crystal (group III nitride crystal) was determined by the X-ray rocking curve measurement of the (11-22) plane. In the region-on-substrate of the GaN crystal, an unsplit diffraction peak having a full width at half maximum of 90 arcsec was observed. In the region-on-substrate-interface having a width ΔW of 500 µm, a split diffraction peak having a full width at half maximum of 380 arcsec was observed.

The (11-22) main plane of the GaN crystal had a threading dislocation density of $1\times10^7$ cm$^{-2}$ in the region-on-substrate and $4\times10^7$ cm$^{-2}$ in the region-on-substrate-interface. The GaN crystal had a carrier concentration of $5\times10^{18}$ cm$^{-3}$. The main impurity atoms of the GaN crystal were oxygen (O) atoms and silicon (Si) atoms. Table II summarizes the results.

Although all the plane orientations of the main planes of the plurality of GaN crystal substrates on which a GaN crystal was grown were (11-22) in Comparative Example 4, substantially the same results were obtained even in the case that at least part of the plane orientations were (-1-122) (which is crystal-geometrically equivalent with (11-22)).

Comparative Example 5

A plurality of GaN crystal substrates (group III nitride crystal substrates) in which a {12-30} main plane had an average roughness Ra of 5 nm were produced in the same way as in Example 1 except that the GaN bulk crystal (group III nitride bulk crystal) was cut along a plurality of planes perpendicular to the <12-30> direction. In some of the GaN crystal substrates, the plane orientation of the main plane did not precisely coincide with {12-30}. In all such GaN crystal substrates, however, the plane orientation of the main plane had an off-angle of five degrees or less with respect to {12-30}. The off-angle was determined by an X-ray diffraction method.

The plurality of GaN crystal substrates were transversely arranged adjacent to each other in a quartz crystal growth container such that (12-30) main planes of the GaN crystal substrates (group III nitride crystal substrates) were parallel to each other and each [0001] direction of the GaN crystal substrates (group III nitride crystal substrates) coincided with each other. Each of the contact surfaces of the plurality of GaN crystal substrates (group III nitride crystal substrates) had an average roughness Ra of 5 nm. A circle inscribed in the plurality of GaN crystal substrates (the group III nitride crystal substrates 10p and 10q) thus arranged had a diameter of 50 mm.

The (12-30) main planes of the plurality of GaN crystal substrates (group III nitride crystal substrates) arranged in the quartz crystal growth container were treated in the same way as in Example 1. A GaN crystal (group III nitride crystal) was then grown on the main planes by the same growth method at the same growth temperature for the same growth time as in Example 1.

The GaN crystal (group III nitride crystal) had a thickness of 0.8 mm, and the crystal growth rate was 20 μm/h. The GaN crystal (group III nitride crystal) had no abnormal crystal growth also in the region-on-substrate-interface 20t and had a (12-30) main plane. The crystallinity of the GaN crystal (group III nitride crystal) was determined by the X-ray rocking curve measurement of the (12-30) plane. In the region-on-substrate of the GaN crystal, an unsplit diffraction peak having a full width at half maximum of 280 arcsec was observed. In the region-on-substrate-interface having a width ΔW of 500 μm, a split diffraction peak having a full width at half maximum of 660 arcsec was observed.

The (12-30) main plane of the GaN crystal had a threading dislocation density of $1 \times 10^7$ cm$^{-2}$ in the region-on-substrate and $7 \times 10^7$ cm$^{-2}$ in the region-on-substrate-interface. The GaN crystal had a carrier concentration of $4 \times 10^{18}$ cm$^{-3}$. The main impurity atoms of the GaN crystal were oxygen (O) atoms and silicon (Si) atoms. Table II summarizes the results.

Although all the plane orientations of the main planes of the plurality of GaN crystal substrates on which a GaN crystal was grown were (12-30) in Comparative Example 5, substantially the same results were obtained even in the case that at least part of the plane orientations were (-1-230) (which is crystal-geometrically equivalent with (12-30)).

TABLE II

| | | | Comparative Example 1 | Comparative Example 2 | Comparative Example 3 | Comparative Example 4 | Comparative Example 5 |
|---|---|---|---|---|---|---|---|
| Group III nitride crystal substrate | Type of substrate | | GaN | GaN | GaN | GaN | GaN |
| | Plane orientation of main plane | | (1-100) | (11-20) | (1-102) | (11-22) | (12-30) |
| | Surface roughness Ra of main plane (mm) | | 5 | 5 | 5 | 5 | 5 |
| | Surface roughness Ra of adjacent plane (mm) | | 5 | 5 | 5 | 5 | 5 |
| Group III nitride crystal | Type of crystal | | GaN | GaN | GaN | GaN | GaN |
| | Crystal growth method | | HVPE | HVPE | HVPE | HVPE | HVPE |
| | Crystal growth temperature (° C.) | | 1020 | 1020 | 1020 | 1020 | 1020 |
| | Crystal growth rate (μm/hr) | | 20 | 20 | 20 | 20 | 20 |
| | Plane orientation of main plane | | (1-100) | (11-20) | (1-102) | (11-22) | (12-30) |
| | Presence of depression in main plane | | No | Yes | No | No | Yes |
| | Full width at half maximum of X-ray diffraction peak (arcsec) | Region-on-substrate | 100 | 250 | 120 | 90 | 280 |
| | | Region-on-substrate-interface | 300 | 620 | 480 | 380 | 660 |
| | Threading dislocation density of main plane (cm$^{-2}$) | Region-on-substrate | $1 \times 10^7$ | $1 \times 10^7$ | $1 \times 10^7$ | $1 \times 10^7$ | $1 \times 10^7$ |
| | | Region-on-substrate-interface | $3 \times 10^7$ | $8 \times 10^7$ | $6 \times 10^7$ | $4 \times 10^7$ | $7 \times 10^7$ |
| | Carrier concentration (cm$^{-3}$) | | $5 \times 10^{18}$ | $5 \times 10^{18}$ | $5 \times 10^{18}$ | $5 \times 10^{18}$ | $4 \times 10^{18}$ |
| | Main impurity atoms | | O, Si | O, Si | O, Si | O, Si | O, Si |

With reference to Tables I and II, the use of a plurality of group III nitride crystal substrates having a main plane with a plane orientation of {1-100}, {11-20}, {1-102}, {11-22}, or {12-30} also yielded a high-crystallinity group III nitride crystal having a main plane with a plane orientation other than {0001} but resulted in a lower crystal growth rate than the use of a plurality of group III nitride crystal substrates having a main plane with a plane orientation of {20-21}, {20-2-1}, {22-41}, or {22-4-1}.

Examples 5 to 8

In Example 5, a GaN crystal (group III nitride crystal) was grown in the same way as in Example 1 except that the inner wall of the quartz crystal growth container was covered with a BN plate and the crystal growth rate was 70 μm/h. In Example 6, a GaN crystal (group III nitride crystal) was grown in the same way as in Example 5 except that the crystal growth rate was 80 μm/h. In Example 7, a GaN crystal (group III nitride crystal) was grown in the same way as in Example 5 except that O$_2$ gas diluted with N$_2$ gas, SiCl$_4$ gas, H$_2$ gas, and CH$_4$ gas were used to add high concentrations of oxygen atoms, silicon atoms, hydrogen atoms, and carbon atoms to the GaN crystal. In Example 8, a GaN crystal (group III nitride crystal) was grown in the same way as in Example 7 except that the crystal growth rate was 80 μm/h. Table III summarizes the results.

Examples 9 to 12

In Example 9, a GaN crystal (group III nitride crystal) was grown in the same way as in Example 2 except that the inner wall of the quartz crystal growth container was covered with a BN plate. In Example 10, a GaN crystal (group III nitride crystal) was grown in the same way as in Example 9 except that the crystal growth rate was 90 μm/h. In Example 11, a GaN crystal (group III nitride crystal) was grown in the same way as in Example 9 except that $O_2$ gas diluted with $N_2$ gas, $SiCl_4$ gas, $H_2$ gas, and $CH_4$ gas were used to add high concentrations of oxygen atoms, silicon atoms, hydrogen atoms, and carbon atoms to the GaN crystal. In Example 12, a GaN crystal (group III nitride crystal) was grown in the same way as in Example 11 except that the crystal growth rate was 90 μm/h. Table III summarizes the results.

substrate having a main plane with a plane orientation with an off-angle of five degrees or less with respect to {20-2-1}. In the grown GaN crystal having an oxygen atom concentration below $1×10^{16}$ cm$^{-3}$, a silicon atom concentration below $6×10^{14}$ cm$^{-3}$, a hydrogen atom concentration below $6×10^{16}$ cm$^{-3}$, and a carbon atom concentration below $1×10^{16}$ cm$^{-3}$, the planar defect density in the {0001} plane of the GaN crystal was as low as 7.4 cm$^{-1}$ at a crystal growth rate of 80 μm/h (less than 90 μm/h) (Example 9) and as high as 37 cm$^{-1}$

TABLE III

| | | Example 5 | Example 6 | Example 7 | Example 8 | Example 9 | Example 10 | Example 11 | Example 12 |
|---|---|---|---|---|---|---|---|---|---|
| Group III nitride crystal substrate | Type of substrate | GaN | GaN | GaN | GaN | GaN | GaN | GaN | GaN |
| | Plane orientation of main plane | (20-21) | (20-21) | (20-21) | (20-21) | (20-2-1) | (20-2-1) | (20-2-1) | (20-2-1) |
| | Surface roughness Ra of main plane (mm) | 5 | 5 | 5 | 5 | 5 | 5 | 5 | 5 |
| | Surface roughness Ra of adjacent plane (mm) | 5 | 5 | 5 | 5 | 5 | 5 | 5 | 5 |
| Group III nitride crystal | Type of crystal | GaN | GaN | GaN | GaN | GaN | GaN | GaN | GaN |
| | Crystal growth method | HVPE | HVPE | HVPE | HVPE | HVPE | HVPE | HVPE | HVPE |
| | Crystal growth temperature (° C.) | 1020 | 1020 | 1020 | 1020 | 1020 | 1020 | 1020 | 1020 |
| | Crystal growth rate (μm/hr) | 70 | 80 | 70 | 80 | 80 | 90 | 80 | 90 |
| | Plane orientation of main plane | (20-21) | (20-21) | (20-21) | (20-21) | (20-2-1) | (20-2-1) | (20-2-1) | (20-2-1) |
| | Presence of depression in main plane | No | Yes | No | Yes | No | Yes | No | Yes |
| Full width at half maximum of X-ray diffraction peak (arcsec) | Region-on-substrate | 110 | 160 | 110 | 170 | 80 | 160 | 90 | 165 |
| | Region-on-substrate-interface | 300 | 390 | 300 | 390 | 290 | 395 | 290 | 380 |
| Threading dislocation density of main plane (cm$^{-2}$) | Region-on-substrate | $1 × 10^7$ | $5 × 10^7$ | $2 × 10^7$ | $5 × 10^7$ | $1 × 10^7$ | $6 × 10^7$ | $2 × 10^7$ | $5 × 10^7$ |
| | Region-on-substrate-interface | $2 × 10^7$ | $7 × 10^7$ | $4 × 10^7$ | $8 × 10^7$ | $2 × 10^7$ | $7 × 10^7$ | $3 × 10^7$ | $8 × 10^7$ |
| | Planar defect density (cm$^{-1}$) | 8.2 | 35 | 7.8 | 49 | 7.4 | 37 | 6.5 | 51 |
| | Carrier concentration (cm$^{-3}$) | ~$1 × 10^{16}$ | ~$1 × 10^{16}$ | $4 × 10^{19}$ | $4 × 10^{19}$ | ~$1 × 10^{16}$ | ~$1 × 10^{16}$ | $4 × 10^{19}$ | $4 × 10^{19}$ |
| Main impurity atoms | [O] (cm$^{-3}$) | $5 × 10^{15}$ | $5 × 10^{15}$ | $5 × 10^{19}$ | $5 × 10^{19}$ | $5 × 10^{15}$ | $5 × 10^{15}$ | $5 × 10^{19}$ | $5 × 10^{19}$ |
| | [Si] (cm$^{-3}$) | $3 × 10^{14}$ | $3 × 10^{14}$ | $6 × 10^{18}$ | $6 × 10^{18}$ | $3 × 10^{14}$ | $3 × 10^{14}$ | $6 × 10^{18}$ | $6 × 10^{18}$ |
| | [H] (cm$^{-3}$) | $4 × 10^{16}$ | $4 × 10^{16}$ | $3 × 10^{18}$ | $3 × 10^{18}$ | $4 × 10^{16}$ | $4 × 10^{16}$ | $3 × 10^{18}$ | $3 × 10^{18}$ |
| | [C] (cm$^{-3}$) | $5 × 10^{15}$ | $5 × 10^{15}$ | $2 × 10^{18}$ | $2 × 10^{18}$ | $5 × 10^{15}$ | $5 × 10^{15}$ | $2 × 10^{18}$ | $2 × 10^{18}$ |

Table III shows the following results in Examples 5 to 8, in which a GaN crystal was grown on a GaN crystal substrate having a main plane with a plane orientation with an off-angle of five degrees or less with respect to {20-21}. In the grown GaN crystal having an oxygen atom concentration below $1×10^{16}$ cm$^{-3}$, a silicon atom concentration below $6×10^{14}$ cm$^{-3}$, a hydrogen atom concentration below $6×10^{16}$ cm$^{-3}$, and a carbon atom concentration below $1×10^{16}$ cm$^{-3}$, the planar defect density in the {0001} plane-in-plane of the GaN crystal was as low as 8.2 cm$^{-1}$ at a crystal growth rate of 70 μm/h (less than 80 μm/h) (Example 5) and as high as 35 cm$^{-1}$ at a crystal growth rate of 80 μm/h (80 μm/h or more) (Example 6). Likewise, in the grown GaN crystal having an oxygen atom concentration above $4×10^{19}$ cm$^{-3}$, a silicon atom concentration above $5×10^{18}$ cm$^{-3}$, a hydrogen atom concentration above $1×10^{18}$ cm$^{-3}$, and a carbon atom concentration above $1×10^{18}$ cm$^{-3}$, the planar defect density in the {0001} plane of the GaN crystal was as low as 7.2 cm$^{-1}$ at a crystal growth rate of 70 μm/h (less than 80 μm/h) (Example 7) and as high as 49 cm$^{-1}$ at a crystal growth rate of 80 μm/h (80 μm/h or more) (Example 8).

Table III also shows the following results in Examples 9 to 12, in which a GaN crystal was grown on a GaN crystal at a crystal growth rate of 90 μm/h (90 μm/h or more) (Example 10). Likewise, in the grown GaN crystal having an oxygen atom concentration above $4×10^{19}$ cm$^{-3}$, a silicon atom concentration above $5×10^{18}$ cm$^{-3}$, a hydrogen atom concentration above $1×10^{18}$ cm$^{-3}$, and a carbon atom concentration above $1×10^{18}$ cm$^{-3}$, the planar defect density in the {0001} plane of the GaN crystal was as low as 6.5 cm$^{-1}$ at a crystal growth rate of 80 μm/h (less than 90 μm/h) (Example 11) and as high as 51 cm$^{-1}$ at a crystal growth rate of 90 μm/h (90 μm/h or more) (Example 12).

Examples 13 to 20

In Examples 13 to 19, a GaN crystal was grown in the same way as in Example 12 except that the concentration of oxygen atoms added to the GaN crystal (group III nitride crystal) was altered. In Example 20, a GaN crystal was grown in the same way as in Example 16 except that the crystal growth rate was 250 μm/h. Table IV summarizes the results.

TABLE IV

| | | Example 13 | Example 14 | Example 15 | Example 16 | Example 17 | Example 18 | Example 19 | Example 20 |
|---|---|---|---|---|---|---|---|---|---|
| Group III nitride crystal substrate | Type of substrate | GaN | GaN | GaN | GaN | GaN | GaN | GaN | GaN |
| | Plane orientation of main plane | (20-2-1) | (20-2-1) | (20-2-1) | (20-2-1) | (20-2-1) | (20-2-1) | (20-2-1) | (20-2-1) |
| | Surface roughness Ra of main plane (mm) | 5 | 5 | 5 | 5 | 5 | 5 | 5 | 5 |
| | Surface roughness Ra of adjacent plane (mm) | 5 | 5 | 5 | 5 | 5 | 5 | 5 | 5 |
| Group III nitride crystal | Type of crystal | GaN | GaN | GaN | GaN | GaN | GaN | GaN | GaN |
| | Crystal growth method | HVPE | HVPE | HVPE | HVPE | HVPE | HVPE | HVPE | HVPE |
| | Crystal growth temperature (° C.) | 1020 | 1020 | 1020 | 1020 | 1020 | 1020 | 1020 | 1020 |
| | Crystal growth rate (μm/hr) | 90 | 90 | 90 | 90 | 90 | 90 | 90 | 250 |
| | Plane orientation of main plane | (20-2-1) | (20-2-1) | (20-2-1) | (20-2-1) | (20-2-1) | (20-2-1) | (20-2-1) | (20-2-1) |
| | Presence of depression in main plane | Yes | Yes | Yes | Yes | Yes | Yes | Yes | Yes |
| | Full width at half maximum of X-ray diffraction peak (arcsec) — Region-on-substrate | 110 | 115 | 110 | 110 | 120 | 125 | 110 | 95 |
| | Full width at half maximum of X-ray diffraction peak (arcsec) — Region-on-substrate-interface | 365 | 350 | 360 | 365 | 370 | 365 | 365 | 280 |
| | Threading dislocation density of main plane (cm$^{-2}$) — Region-on-substrate | $2 \times 10^7$ | $1 \times 10^7$ | $1 \times 10^7$ | $1 \times 10^7$ | $1 \times 10^7$ | $2 \times 10^7$ | $4 \times 10^7$ | $5 \times 10^6$ |
| | Threading dislocation density of main plane (cm$^{-2}$) — Region-on-substrate-interface | $4 \times 10^7$ | $4 \times 10^7$ | $4 \times 10^7$ | $4 \times 10^7$ | $4 \times 10^7$ | $4 \times 10^7$ | $5 \times 10^7$ | $9 \times 10^6$ |
| | Planar defect density (cm$^{-1}$) | 25 | 14.8 | 13.5 | 12.6 | 14.6 | 17.5 | 34 | 18.7 |
| | Carrier concentration (cm$^{-3}$) | $5 \times 10^{18}$ | $5 \times 10^{18}$ | $4 \times 10^{18}$ | $5 \times 10^{18}$ | $1 \times 10^{19}$ | $4 \times 10^{19}$ | $6 \times 10^{19}$ | $6 \times 10^{18}$ |
| | Main impurity atoms [O] (cm$^{-3}$) | $9 \times 10^{15}$ | $2 \times 10^{16}$ | $5 \times 10^{16}$ | $2 \times 10^{18}$ | $9 \times 10^{18}$ | $2 \times 10^{19}$ | $6 \times 10^{19}$ | $2 \times 10^{18}$ |
| | [Si] (cm$^{-3}$) | $6 \times 10^{18}$ | $6 \times 10^{18}$ | $6 \times 10^{18}$ | $6 \times 10^{18}$ | $6 \times 10^{18}$ | $6 \times 10^{18}$ | $6 \times 10^{18}$ | $6 \times 10^{18}$ |
| | [H] (cm$^{-3}$) | $3 \times 10^{18}$ | $3 \times 10^{18}$ | $3 \times 10^{18}$ | $3 \times 10^{18}$ | $3 \times 10^{18}$ | $3 \times 10^{18}$ | $3 \times 10^{18}$ | $3 \times 10^{18}$ |
| | [C] (cm$^{-3}$) | $2 \times 10^{18}$ | $2 \times 10^{18}$ | $2 \times 10^{18}$ | $2 \times 10^{18}$ | $2 \times 10^{18}$ | $2 \times 10^{18}$ | $2 \times 10^{18}$ | $2 \times 10^{18}$ |

With reference to Table IV, the planar defect density in the {0001} plane of a GaN crystal grown on a GaN crystal substrate having a main plane with a plane orientation with an off-angle of five degrees or less with respect to {20-2-1} was reduced even at a crystal growth rate of 90 μm/h (90 μm/h or more) when the concentration of oxygen atom, which was one of the impurity atoms in the GaN crystal, was preferably $1 \times 10^{16}$ cm$^{-3}$ or more and $4 \times 10^{19}$ cm$^{-3}$ or less (Examples 14 to 18), more preferably $5 \times 10^{16}$ cm$^{-3}$ or more and $1 \times 10^{19}$ cm$^{-3}$ or less (Examples 15 to 17), still more preferably $1 \times 10^{17}$ cm$^{-3}$ or more and $8 \times 10^{18}$ cm$^{-3}$ or less (Example 16). An oxygen atom concentration of the GaN crystal of $1 \times 10^{17}$ cm$^{-3}$ or more and $8 \times 10^{18}$ cm$^{-3}$ or less resulted in a low planar defect density in the {0001} plane of the GaN crystal even when the crystal growth rate was increased to 250 μm/h.

Examples 21 to 27

In Examples 21 to 27, a GaN crystal was grown in the same way as in Example 12 except that the concentration of silicon atoms added to the GaN crystal (group III nitride crystal) grown was altered. Table V summarizes the results.

TABLE V

| | | Example 21 | Example 22 | Example 23 | Example 24 | Example 25 | Example 26 | Example 27 |
|---|---|---|---|---|---|---|---|---|
| Group III nitride crystal substrate | Type of substrate | GaN | GaN | GaN | GaN | GaN | GaN | GaN |
| | Plane orientation of main plane | (20-2-1) | (20-2-1) | (20-2-1) | (20-2-1) | (20-2-1) | (20-2-1) | (20-2-1) |
| | Surface roughness Ra of main plane (mm) | 5 | 5 | 5 | 5 | 5 | 5 | 5 |
| | Surface roughness Ra of adjacent plane (mm) | 5 | 5 | 5 | 5 | 5 | 5 | 5 |
| Group III nitride crystal | Type of crystal | GaN | GaN | GaN | GaN | GaN | GaN | GaN |
| | Crystal growth method | HVPE | HVPE | HVPE | HVPE | HVPE | HVPE | HVPE |
| | Crystal growth temperature (° C.) | 1020 | 1020 | 1020 | 1020 | 1020 | 1020 | 1020 |
| | Crystal growth rate (μm/hr) | 90 | 90 | 90 | 90 | 90 | 90 | 90 |
| | Plane orientation of main plane | (20-2-1) | (20-2-1) | (20-2-1) | (20-2-1) | (20-2-1) | (20-2-1) | (20-2-1) |
| | Presence of depression in main plane | Yes | Yes | Yes | Yes | Yes | Yes | Yes |
| | Full width at half maximum of X-ray diffraction peak (arcsec) — Region-on-substrate | 120 | 120 | 110 | 120 | 120 | 118 | 140 |
| | Full width at half maximum of X-ray diffraction peak (arcsec) — Region-on-substrate-interface | 380 | 376 | 376 | 376 | 365 | 376 | 376 |
| | Threading dislocation density of main plane (cm$^{-2}$) — Region-on-substrate | $3 \times 10^7$ | $2 \times 10^7$ | $2 \times 10^7$ | $2 \times 10^7$ | $2 \times 10^7$ | $2 \times 10^7$ | $4 \times 10^7$ |
| | Threading dislocation density of main plane (cm$^{-2}$) — Region-on-substrate-interface | $5 \times 10^7$ | $4 \times 10^7$ | $4 \times 10^7$ | $4 \times 10^7$ | $4 \times 10^7$ | $4 \times 10^7$ | $4 \times 10^7$ |
| | Planar defect density (cm$^{-1}$) | 23.9 | 18.4 | 16.3 | 15.3 | 17.1 | 18.4 | 32.3 |
| | Carrier concentration (cm$^{-3}$) | $3 \times 10^{19}$ | $3 \times 10^{19}$ | $3 \times 10^{19}$ | $3 \times 10^{19}$ | $3 \times 10^{19}$ | $3 \times 10^{19}$ | $4 \times 10^{19}$ |
| | Main impurity atoms [O] (cm$^{-3}$) | $5 \times 10^{19}$ | $5 \times 10^{19}$ | $5 \times 10^{19}$ | $5 \times 10^{19}$ | $5 \times 10^{19}$ | $5 \times 10^{19}$ | $5 \times 10^{19}$ |
| | [Si] (cm$^{-3}$) | $5 \times 10^{14}$ | $7 \times 10^{14}$ | $2 \times 10^{15}$ | $1 \times 10^{18}$ | $2 \times 10^{18}$ | $4 \times 10^{18}$ | $6 \times 10^{18}$ |
| | [H] (cm$^{-3}$) | $3 \times 10^{18}$ | $3 \times 10^{18}$ | $3 \times 10^{18}$ | $3 \times 10^{18}$ | $3 \times 10^{18}$ | $3 \times 10^{18}$ | $3 \times 10^{18}$ |
| | [C] (cm$^{-3}$) | $2 \times 10^{18}$ | $2 \times 10^{18}$ | $2 \times 10^{18}$ | $2 \times 10^{18}$ | $2 \times 10^{18}$ | $2 \times 10^{18}$ | $2 \times 10^{18}$ |

With reference to Table V, the planar defect density in the {0001} plane of a GaN crystal grown on a GaN crystal substrate having a main plane with a plane orientation with an off-angle of five degrees or less with respect to {20-2-1} was reduced even at a crystal growth rate of 90 μm/h (90 μm/h or more) when the concentration of silicon atom, which was one of the impurity atoms in the GaN crystal, was preferably $6×10^{14}$ cm$^{-3}$ or more and $5×10^{18}$ cm$^{-3}$ or less (Examples 22 to 26), more preferably $1×10^{15}$ cm$^{-3}$ or more and $3×10^{18}$ cm$^{-3}$ or less (Examples 23 to 25), still more preferably $1×10^{16}$ cm$^{-3}$ or more and $1×10^{18}$ cm$^{-3}$ or less (Example 24).

Examples 28 to 34

In Examples 28 to 34, a GaN crystal was grown in the same way as in Example 12 except that the concentration of hydrogen atoms added to the GaN crystal (group III nitride crystal) grown was altered. Table VI summarizes the results.

strate having a main plane with a plane orientation with an off-angle of five degrees or less with respect to {20-2-1} was reduced even at a crystal growth rate of 90 μm/h (90 μm/h or more) when the concentration of hydrogen atom, which was one of the impurity atoms in the GaN crystal, was preferably $6×10^{16}$ cm$^{-3}$ or more and $1×10^{18}$ cm$^{-3}$ or less (Examples 29 to 33), more preferably $1×10^{17}$ cm$^{-3}$ or more and $9×10^{17}$ cm$^{-3}$ or less (Examples 30 to 32), still more preferably $2×10^{17}$ cm$^{-3}$ or more and $7×10^{17}$ cm$^{-3}$ or less (Example 31).

Examples 35 to 41

In Examples 35 to 41, a GaN crystal was grown in the same way as in Example 12 except that the concentration of carbon

TABLE VI

| | | Example 28 | Example 29 | Example 30 | Example 31 | Example 32 | Example 33 | Example 34 |
|---|---|---|---|---|---|---|---|---|
| Group III nitride crystal substrate | Type of substrate | GaN | GaN | GaN | GaN | GaN | GaN | GaN |
| | Plane orientation of main plane | (20-2-1) | (20-2-1) | (20-2-1) | (20-2-1) | (20-2-1) | (20-2-1) | (20-2-1) |
| | Surface roughness Ra of main plane (nm) | 5 | 5 | 5 | 5 | 5 | 5 | 5 |
| | Surface roughness Ra of adjacent plane (nm) | 5 | 5 | 5 | 5 | 5 | 5 | 5 |
| Group III nitride crystal | Type of crystal | GaN | GaN | GaN | GaN | GaN | GaN | GaN |
| | Crystal growth method | HVPE | HVPE | HVPE | HVPE | HVPE | HVPE | HVPE |
| | Crystal growth temperature (° C.) | 1020 | 1020 | 1020 | 1020 | 1020 | 1020 | 1020 |
| | Crystal growth rate (μm/hr) | 90 | 90 | 90 | 90 | 90 | 90 | 90 |
| | Plane orientation of main plane | (20-2-1) | (20-2-1) | (20-2-1) | (20-2-1) | (20-2-1) | (20-2-1) | (20-2-1) |
| | Presence of depression in main plane | Yes | Yes | Yes | Yes | Yes | Yes | Yes |
| | Full width at half maximum of X-ray diffraction peak (arcsec) | Region-on-substrate | 120 | 122 | 125 | 120 | 120 | 115 | 135 |
| | | Region-on-substrate-interface | 375 | 370 | 372 | 370 | 368 | 365 | 384 |
| | Threading dislocation density of main plane (cm$^{-2}$) | Region-on-substrate | $2×10^7$ | $2×10^7$ | $2×10^7$ | $2×10^7$ | $2×10^7$ | $2×10^7$ | $2×10^7$ |
| | | Region-on-substrate-interface | $5×10^7$ | $5×10^7$ | $5×10^7$ | $5×10^7$ | $5×10^7$ | $5×10^7$ | $5×10^7$ |
| | Planar defect density (cm$^{-1}$) | | 22.3 | 17.6 | 16.1 | 16.1 | 16.3 | 17.5 | 28.1 |
| | Carrier concentration (cm$^{-3}$) | | $4×10^{19}$ | $4×10^{19}$ | $4×10^{19}$ | $4×10^{19}$ | $4×10^{19}$ | $4×10^{19}$ | $4×10^{19}$ |
| | Main impurity atoms | [O] (cm$^{-3}$) | $5×10^{19}$ | $5×10^{19}$ | $5×10^{19}$ | $5×10^{19}$ | $5×10^{19}$ | $5×10^{19}$ | $5×10^{19}$ |
| | | [Si] (cm$^{-3}$) | $6×10^{18}$ | $6×10^{18}$ | $6×10^{18}$ | $6×10^{18}$ | $6×10^{18}$ | $6×10^{18}$ | $6×10^{18}$ |
| | | [H] (cm$^{-3}$) | $5×10^{16}$ | $7×10^{16}$ | $1×10^{17}$ | $7×10^{17}$ | $8×10^{17}$ | $1×10^{18}$ | $2×10^{18}$ |
| | | [C] (cm$^{-3}$) | $2×10^{18}$ | $2×10^{18}$ | $2×10^{18}$ | $2×10^{18}$ | $2×10^{18}$ | $2×10^{18}$ | $2×10^{18}$ |

With reference to Table VI, the planar defect density in the {0001} plane of a GaN crystal grown on a GaN crystal substrate having a main plane with a plane orientation with an off-angle of five degrees or less with respect to {20-2-1} was reduced even at a crystal growth rate of 90 μm/h (90 μm/h or more) when the concentration of hydrogen atom, which was one of the impurity atoms added to the GaN crystal (group III nitride crystal) grown was altered. Table VII summarizes the results.

TABLE VII

| | | Example 35 | Example 36 | Example 37 | Example 38 | Example 39 | Example 40 | Example 41 |
|---|---|---|---|---|---|---|---|---|
| Group III nitride crystal substrate | Type of substrate | GaN | GaN | GaN | GaN | GaN | GaN | GaN |
| | Plane orientation of main plane | (20-2-1) | (20-2-1) | (20-2-1) | (20-2-1) | (20-2-1) | (20-2-1) | (20-2-1) |
| | Surface roughness Ra of main plane (nm) | 5 | 5 | 5 | 5 | 5 | 5 | 5 |
| | Surface roughness Ra of adjacent plane (nm) | 5 | 5 | 5 | 5 | 5 | 5 | 5 |
| Group III nitride crystal | Type of crystal | GaN | GaN | GaN | GaN | GaN | GaN | GaN |
| | Crystal growth method | HVPE | HVPE | HVPE | HVPE | HVPE | HVPE | HVPE |
| | Crystal growth temperature (° C.) | 1020 | 1020 | 1020 | 1020 | 1020 | 1020 | 1020 |
| | Crystal growth rate (μm/hr) | 90 | 90 | 90 | 90 | 90 | 90 | 90 |
| | Plane orientation of main plane | (20-2-1) | (20-2-1) | (20-2-1) | (20-2-1) | (20-2-1) | (20-2-1) | (20-2-1) |
| | Presence of depression in main plane | Yes | Yes | Yes | Yes | Yes | Yes | Yes |
| | Full width at half maximum of X-ray diffraction peak (arcsec) | Region-on-substrate | 125 | 120 | 110 | 110 | 115 | 120 | 125 |
| | | Region-on-substrate-interface | 378 | 375 | 375 | 375 | 370 | 370 | 378 |
| | Threading dislocation density of main plane (cm$^{-2}$) | Region-on-substrate | $1×10^7$ | $1×10^7$ | $1×10^7$ | $1×10^7$ | $1×10^7$ | $1×10^7$ | $2×10^7$ |
| | | Region-on-substrate-interface | $4×10^7$ | $4×10^7$ | $4×10^7$ | $4×10^7$ | $4×10^7$ | $4×10^7$ | $4×10^7$ |
| | Planar defect density (cm$^{-1}$) | | 25.5 | 19.7 | 17.4 | 16 | 17.8 | 18.6 | 31.1 |
| | Carrier concentration (cm$^{-3}$) | | $5×10^{19}$ | $5×10^{19}$ | $5×10^{19}$ | $5×10^{19}$ | $5×10^{19}$ | $5×10^{19}$ | $5×10^{19}$ |
| | Main impurity atoms | [O] (cm$^{-3}$) | $5×10^{19}$ | $5×10^{19}$ | $5×10^{19}$ | $5×10^{19}$ | $5×10^{19}$ | $5×10^{19}$ | $5×10^{19}$ |
| | | [Si] (cm$^{-3}$) | $6×10^{18}$ | $6×10^{18}$ | $6×10^{18}$ | $6×10^{18}$ | $6×10^{18}$ | $6×10^{18}$ | $6×10^{18}$ |

TABLE VII-continued

|  | Example 35 | Example 36 | Example 37 | Example 38 | Example 39 | Example 40 | Example 41 |
|---|---|---|---|---|---|---|---|
| [H] (cm$^{-3}$) | $3 \times 10^{18}$ | $3 \times 10^{18}$ | $3 \times 10^{18}$ | $3 \times 10^{18}$ | $3 \times 10^{18}$ | $3 \times 10^{18}$ | $3 \times 10^{18}$ |
| [C] (cm$^{-3}$) | $8 \times 10^{15}$ | $2 \times 10^{16}$ | $6 \times 10^{16}$ | $3 \times 10^{17}$ | $8 \times 10^{17}$ | $1 \times 10^{18}$ | $3 \times 10^{18}$ |

With reference to Table VII, the planar defect density in the {0001} plane of a GaN crystal grown on a GaN crystal substrate having a main plane with a plane orientation with an off-angle of five degrees or less with respect to {20-2-1} was reduced even at a crystal growth rate of 90 μm/h (90 μm/h or more) when the concentration of carbon atom, which was one of the impurity atoms in the GaN crystal, was preferably $1 \times 10^{16}$ cm$^{-3}$ or more and $1 \times 10^{18}$ cm$^{-3}$ or less (Examples 36 to 40), more preferably $5 \times 10^{16}$ cm$^{-3}$ or more and $9 \times 10^{17}$ cm$^{-3}$ or less (Examples 37 to 39), still more preferably $9 \times 10^{16}$ cm$^{-3}$ or more and $7 \times 10^{17}$ cm$^{-3}$ or less (Example 38).

Examples 42 to 47

In Examples 42 to 47, a GaN crystal was grown in the same way as in Example 12 except that the concentration of an impurity atom added to the GaN crystal (group III nitride crystal) grown was adjusted to satisfy two of the oxygen atom concentration of $1 \times 10^{16}$ cm$^{-3}$ or more and $4 \times 10^{19}$ cm$^{-3}$ or less, the silicon atom concentration of $6 \times 10^{14}$ cm$^{-3}$ or more and $5 \times 10^{18}$ cm$^{-3}$ or less, the hydrogen atom concentration of $6 \times 10^{16}$ cm$^{-3}$ or more and $1 \times 10^{18}$ cm$^{-3}$ or less, and the carbon atom concentration of $1 \times 10^{16}$ cm$^{-3}$ or more and $1 \times 10^{18}$ cm$^{-3}$ or less. Table VIII summarizes the results.

that is, the oxygen atom concentration, the silicon atom concentration, the hydrogen atom concentration, and the carbon atom concentration, of the GaN crystal were in the predetermined range described above (Examples 42 to 47).

Examples 48 to 51

In Examples 48 to 51, a GaN crystal was grown in the same way as in Example 12 except that the concentration of an impurity atom added to the GaN crystal (group III nitride crystal) grown was adjusted to satisfy three of the oxygen atom concentration of $1 \times 10^{16}$ cm$^{-3}$ or more and $4 \times 10^{19}$ cm$^{-3}$ or less, the silicon atom concentration of $6 \times 10^{14}$ cm$^{-3}$ or more and $5 \times 10^{18}$ cm$^{-3}$ or less, the hydrogen atom concentration of $6 \times 10^{16}$ cm$^{-3}$ or more and $1 \times 10^{18}$ cm$^{-3}$ or less, and the carbon atom concentration of $1 \times 10^{16}$ cm$^{-3}$ or more and $1 \times 10^{18}$ cm$^{-3}$ or less. Table IX summarizes the results.

Examples 52 and 53

In Example 52, a GaN crystal was grown in the same way as in Example 12 except that the concentration of an impurity atom added to the GaN crystal (group III nitride crystal) grown was adjusted to satisfy all (four) of the oxygen atom concentration of $1 \times 10^{16}$ cm$^{-3}$ or more and $4 \times 10^{19}$ cm$^{-3}$ or less, the silicon atom concentration of $6 \times 10^{14}$ cm$^{-3}$ or more

TABLE VIII

|  |  | Example 42 | Example 43 | Example 44 | Example 45 | Example 46 | Example 47 |
|---|---|---|---|---|---|---|---|
| Group III nitride crystal substrate | Type of substrate | GaN | GaN | GaN | GaN | GaN | GaN |
|  | Plane orientation of main plane | (20-2-1) | (20-2-1) | (20-2-1) | (20-2-1) | (20-2-1) | (20-2-1) |
|  | Surface roughness Ra of main plane (mm) | 5 | 5 | 5 | 5 | 5 | 5 |
|  | Surface roughness Ra of adjacent plane (mm) | 5 | 5 | 5 | 5 | 5 | 5 |
| Group III nitride crystal | Type of crystal | GaN | GaN | GaN | GaN | GaN | GaN |
|  | Crystal growth method | HVPE | HVPE | HVPE | HVPE | HVPE | HVPE |
|  | Crystal growth temperature (° C.) | 1020 | 1020 | 1020 | 1020 | 1020 | 1020 |
|  | Crystal growth rate (μm/hr) | 90 | 90 | 90 | 90 | 90 | 90 |
|  | Plane orientation of main plane | (20-2-1) | (20-2-1) | (20-2-1) | (20-2-1) | (20-2-1) | (20-2-1) |
|  | Presence of depression in main plane | Yes | Yes | Yes | Yes | Yes | Yes |
|  | Full width at half maximum of X-ray diffraction peak (arcsec) | Region-on-substrate | 90 | 88 | 95 | 84 | 80 | 80 |
|  |  | Region-on-substrate-interface | 310 | 280 | 320 | 240 | 210 | 220 |
|  | Threading dislocation density of main plane (cm$^{-2}$) | Region-on-substrate | $4 \times 10^6$ | $4 \times 10^6$ | $6 \times 10^6$ | $3 \times 10^6$ | $3 \times 10^6$ | $3 \times 10^6$ |
|  |  | Region-on-substrate-interface | $9 \times 10^6$ | $8 \times 10^6$ | $1 \times 10^7$ | $7 \times 10^6$ | $7 \times 10^6$ | $6 \times 10^6$ |
|  | Planar defect density (cm$^{-1}$) |  | 6 | 7.3 | 6.7 | 10 | 9.6 | 11.8 |
|  | Carrier concentration (cm$^{-3}$) |  | $1 \times 10^{18}$ | $4 \times 10^{18}$ | $6 \times 10^{18}$ | $5 \times 10^{19}$ | $5 \times 10^{19}$ | $5 \times 10^{19}$ |
|  | Main impurity atoms | [O] (cm$^{-3}$) | $2 \times 10^{18}$ | $2 \times 10^{18}$ | $2 \times 10^{18}$ | $5 \times 10^{19}$ | $5 \times 10^{19}$ | $5 \times 10^{19}$ |
|  |  | [Si] (cm$^{-3}$) | $1 \times 10^{18}$ | $6 \times 10^{18}$ | $6 \times 10^{18}$ | $1 \times 10^{18}$ | $1 \times 10^{18}$ | $6 \times 10^{18}$ |
|  |  | [H] (cm$^{-3}$) | $3 \times 10^{18}$ | $7 \times 10^{17}$ | $3 \times 10^{18}$ | $7 \times 10^{17}$ | $3 \times 10^{18}$ | $7 \times 10^{17}$ |
|  |  | [C] (cm$^{-3}$) | $2 \times 10^{18}$ | $2 \times 10^{18}$ | $3 \times 10^{17}$ | $2 \times 10^{18}$ | $3 \times 10^{17}$ | $3 \times 10^{17}$ |

With reference to Table VIII, the planar defect density in the {0001} plane of a GaN crystal grown on a GaN crystal substrate having a main plane with a plane orientation with an off-angle of five degrees or less with respect to {20-2-1} was greatly reduced even at a crystal growth rate of 90 μm/h (90 μm/h or more) when two of the impurity atom concentrations, and $5 \times 10^{18}$ cm$^{-3}$ or less, the hydrogen atom concentration of $6 \times 10^{16}$ cm$^{-3}$ or more and $1 \times 10^{18}$ cm$^{-3}$ or less, and the carbon atom concentration of $1 \times 10^{16}$ cm$^{-3}$ or more and $1 \times 10^{18}$ cm$^{-3}$ or less. In Example 53, a GaN crystal was grown in the same way as in Example 52 except that the crystal growth rate was 250 μm/h. Table IX summarizes the results.

TABLE IX

|  |  | Example 48 | Example 49 | Example 50 | Example 51 | Example 52 | Example 53 |
|---|---|---|---|---|---|---|---|
| Group III nitride crystal substrate | Type of substrate | GaN | GaN | GaN | GaN | GaN | GaN |
|  | Plane orientation of main plane | (20-2-1) | (20-2-1) | (20-2-1) | (20-2-1) | (20-2-1) | (20-2-1) |
|  | Surface roughness Ra of main plane (mm) | 5 | 5 | 5 | 5 | 5 | 5 |
|  | Surface roughness Ra of adjacent plane (mm) | 5 | 5 | 5 | 5 | 5 | 5 |
| Group III nitride crystal | Type of crystal | GaN | GaN | GaN | GaN | GaN | GaN |
|  | Crystal growth method | HVPE | HVPE | HVPE | HVPE | HVPE | HVPE |
|  | Crystal growth temperature (° C.) | 1020 | 1020 | 1020 | 1020 | 1020 | 1020 |
|  | Crystal growth rate (µm/hr) | 90 | 90 | 90 | 90 | 90 | 250 |
|  | Plane orientation of main plane | (20-2-1) | (20-2-1) | (20-2-1) | (20-2-1) | (20-2-1) | (20-2-1) |
|  | Presence of depression in main plane | Yes | Yes | Yes | Yes | Yes | Yes |
|  | Full width at half maximum of X-ray diffraction peak (arcsec) — Region-on-substrate | 80 | 77 | 74 | 80 | 65 | 70 |
|  | Full width at half maximum of X-ray diffraction peak (arcsec) — Region-on-substrate-interface | 160 | 135 | 120 | 190 | 80 | 95 |
|  | Threading dislocation density of main plane ($cm^{-2}$) — Region-on-substrate | $8 \times 10^5$ | $6 \times 10^5$ | $6 \times 10^5$ | $7 \times 10^5$ | $2 \times 10^5$ | $4 \times 10^5$ |
|  | Threading dislocation density of main plane ($cm^{-2}$) — Region-on-substrate-interface | $5 \times 10^6$ | $3 \times 10^6$ | $4 \times 10^6$ | $6 \times 10^6$ | $2 \times 10^6$ | $3 \times 10^6$ |
|  | Planar defect density ($cm^{-1}$) | 3.8 | 3.6 | 3.2 | 4.9 | 0.3 | 0.8 |
|  | Carrier concentration ($cm^{-3}$) | $1 \times 10^{18}$ | $7 \times 10^{18}$ | $1 \times 10^{18}$ | $5 \times 10^{19}$ | $1 \times 10^{18}$ | $4 \times 10^{18}$ |
|  | Main impurity atoms [O] ($cm^{-3}$) | $2 \times 10^{18}$ | $2 \times 10^{18}$ | $2 \times 10^{18}$ | $5 \times 10^{19}$ | $2 \times 10^{18}$ | $2 \times 10^{18}$ |
|  | [Si] ($cm^{-3}$) | $1 \times 10^{18}$ | $6 \times 10^{18}$ | $1 \times 10^{18}$ | $1 \times 10^{18}$ | $1 \times 10^{18}$ | $1 \times 10^{18}$ |
|  | [H] ($cm^{-3}$) | $7 \times 10^{17}$ | $7 \times 10^{17}$ | $3 \times 10^{18}$ | $7 \times 10^{17}$ | $7 \times 10^{17}$ | $7 \times 10^{17}$ |
|  | [C] ($cm^{-3}$) | $2 \times 10^{18}$ | $3 \times 10^{17}$ | $3 \times 10^{17}$ | $3 \times 10^{17}$ | $3 \times 10^{17}$ | $3 \times 10^{17}$ |

With reference to Table IX, the planar defect density in the {0001} plane of a GaN crystal grown on a GaN crystal substrate having a main plane with a plane orientation with an off-angle of five degrees or less with respect to {20-2-1} was more greatly reduced even at a crystal growth rate of 90 µm/h (90 µm/h or more) when three of the impurity atom concentrations, that is, the oxygen atom concentration, the silicon atom concentration, the hydrogen atom concentration, and the carbon atom concentration, of the GaN crystal were in the predetermined range described above (Examples 48 to 51). The planar defect density in the {0001} plane of the GaN crystal was still more greatly reduced when all (four) of the impurity atom concentrations, that is, the oxygen atom concentration, the silicon atom concentration, the hydrogen atom concentration, and the carbon atom concentration, of the GaN crystal were in the predetermined range described above (Example 52). Furthermore, the planar defect density in the {0001} plane of the GaN crystal was very low even at a crystal growth rate as high as 250 µm/h when all (four) of the impurity atom concentrations, that is, the oxygen atom concentration, the silicon atom concentration, the hydrogen atom concentration, and the carbon atom concentration, of the GaN crystal were in the predetermined range described above.

Examples 54 and 55

In Example 54, a GaN crystal was grown in the same way as in Example 52 except that the GaN crystal (group III nitride crystal) prepared in Example 52 was cut along planes parallel to a main plane of a GaN crystal substrate (group III nitride substrate), the main planes were ground and polished to produce a plurality of additional GaN crystal substrates (additional group III nitride crystal substrates) having a thickness of 1 mm and an average roughness Ra of the main plane of 5 nm, a crystal was grown on the (20-21) main plane of the second additional GaN crystal substrate from the bottom, and the crystal growth rate was 140 µm/h. In Example 55, a GaN crystal was grown in the same way as in Example 52 except that the GaN crystal (group III nitride crystal) prepared in Example 52 was cut along planes parallel to a main plane of a GaN crystal substrate (group III nitride substrate), the main planes were ground and polished to produce a plurality of additional GaN crystal substrates (additional group III nitride crystal substrates) having a thickness of 1 mm and an average roughness Ra of the main plane of 5 nm, a crystal was grown on the (20-21) main plane of the second additional GaN crystal substrate from the bottom, and the crystal growth rate was 150 µm/h. Table X summarizes the results.

TABLE X

|  |  |  | Example 54 | Example 55 |
|---|---|---|---|---|
| Group III nitride crystal substrate | Type of substrate |  | Substrate obtained from GaN crystal prepared in Example 52 (second from bottom) | Substrate obtained from GaN crystal prepared in Example 52 (second from bottom) |
|  | Plane orientation of main plane |  | (20-2-1) | (20-2-1) |
|  | Surface roughness Ra of main plane (mm) |  | 5 | 5 |
|  | Surface roughness Ra of adjacent plane (mm) |  | 5 | 5 |
| Group III nitride crystal | Type of crystal |  | GaN | GaN |
|  | Crystal growth method |  | HVPE | HVPE |
|  | Crystal growth temperature (° C.) |  | 1020 | 1020 |
|  | Crystal growth rate (µm/hr) |  | 140 | 150 |
|  | Plane orientation of main plane |  | (20-2-1) | (20-2-1) |
|  | Presence of depression in main plane |  | No | Yes |
|  | Full width at half maximum of X-ray diffraction peak (arcsec) | Region-on-substrate | 65 | 70 |
|  |  | Region-on- | 80 | 95 |

TABLE X-continued

|  |  | Example 54 | Example 55 |
|---|---|---|---|
| Threading dislocation density of main plane (cm$^{-2}$) | substrate-interface Region-on-substrate | $2 \times 10^5$ | $4 \times 10^5$ |
|  | Region-on-substrate-interface | $2 \times 10^6$ | $3 \times 10^6$ |
| Planar defect density (cm$^{-1}$) |  | 0.3 | 0.3 |
| Carrier concentration (cm$^{-3}$) |  | $4 \times 10^{19}$ | $1 \times 10^{18}$ |
| Main impurity atoms | [O](cm$^{-3}$) | $5 \times 10^{19}$ | $2 \times 10^{18}$ |
|  | [Si](cm$^{-3}$) | $6 \times 10^{18}$ | $1 \times 10^{18}$ |
|  | [H](cm$^{-3}$) | $3 \times 10^{18}$ | $7 \times 10^{17}$ |
|  | [C](cm$^{-3}$) | $2 \times 10^{18}$ | $3 \times 10^{17}$ |

With reference to Table X, as compared with the growth of a GaN crystal, the planar defect density in the {0001} plane of a GaN crystal could be markedly reduced in the growth of an additional GaN crystal (an additional group III nitride crystal) while the crystal growth face was kept flat up to a higher crystal growth rate (below 150 μm/h) using an additional GaN crystal substrate (an additional group III nitride crystal) prepared from a GaN crystal (group III nitride crystal) (Example 54). Even at the crystal growth rate at which facets were formed on the crystal growth face, the planar defect density in the {0001} plane of the GaN crystal could be markedly reduced when all (four) of the impurity atom concentrations, that is, the oxygen atom concentration, the silicon atom concentration, the hydrogen atom concentration, and the carbon atom concentration, of the GaN crystal were in the predetermined range described above.

It is to be understood that the embodiments and examples disclosed herein are illustrated by way of example and not by way of limitation in all respects. The scope of the present invention is defined by the appended claims rather than by the description preceding them. All changes that fall within the scope of the claims and the equivalence thereof are therefore intended to be embraced by the claims.

Industrial Applicability

Group III nitride crystals produced by a production method according to the present invention can be used in light emitting devices (such as light-emitting diodes and laser diodes), electronic devices (such as rectifiers, bipolar transistors, field-effect transistors, and high electron mobility transistors (HEMT)), semiconductor sensors (such as temperature sensors, pressure sensors, radiation sensors, and visible-ultraviolet photodetectors), surface acoustic wave (SAW) devices, acceleration sensors, micro electro mechanical systems (MEMS) components, piezoelectric vibrators, resonators, or piezoelectric actuators.

Reference Signs List

1 Group III nitride bulk crystal, 10p, 10q, 20p Group III nitride crystal substrate, 10pm, 10qm, 20m, 20 pm, 30m Main plane, 10pt, 10qt Contact surface, 20, Group III nitride crystal, 20g, 30g Crystal growth face, 20gf, 20mf, 30gf, 30mf Facet, 20s, 30s Region-on-substrate, 20t, 30t Region-on-substrate-interface, 20tc Vertical plane, 20v, 30v Depression, 90 Base substrate, 91 Mask layer, 91w Window

The invention claimed is:

1. A group III nitride crystal characterized by the following properties:
having a main plane with a crystal-geometrically equivalent plane orientation selected from the group consisting of {20-21}, {20-2-1}, {22-41}, and {22-4-1};
an oxygen-atom concentration of between $1 \times 10^{16}$ cm$^{-3}$ and $4 \times 10^{19}$ cm$^{-3}$ inclusive;
a silicon-atom concentration of between $6 \times 10^{14}$ cm$^{-3}$ and $5 \times 10^{18}$ cm$^{-3}$ inclusive;
a hydrogen-atom concentration of between $6 \times 10^{16}$ cm$^{-3}$ and $1 \times 10^{18}$ cm$^{-3}$ inclusive;
a carbon-atom concentration of between $1 \times 10^{16}$ cm$^{-3}$ and $1 \times 10^{18}$ cm$^{-3}$ inclusive; and
a planar defect density of between 0.3 and 51 defects/cm in a cross-section through the crystal perpendicular to either the <1-210>direction or to the <10-10>direction.

2. The group III nitride crystal according to claim 1, wherein the main plane has an area of 10 cm$^2$ or more.

3. A method for producing the group III nitride crystal of claim 1, comprising the steps of:
cutting a plurality of Group III nitride crystal substrates having a main plane from a Group III nitride bulk crystal, the main plane having a plane orientation with an off-angle of five degrees or less with respect to a crystal-geometrically equivalent plane orientation selected from the group consisting of {20-21}, {20-2-1}, {22-41}, and {22-4-1};
transversely arranging the substrates adjacent to each other such that the main planes of the substrates are parallel to each other and each [0001] direction of the substrates coincides with each other; and
growing on the main planes of the substrates a Group III nitride crystal having said oxygen-, silicon-, hydrogen- and carbon-atom concentrations.

4. The method for producing a group III nitride crystal according to claim 3, wherein the average roughness Ra of each contact surface of the substrates adjacent to each other is 50 nm or less.

5. The method for producing a group III nitride crystal according to claim 3, wherein the method for growing the group III nitride crystal is a hydride vapor phase epitaxy method.

6. The method for producing a group III nitride crystal according to claim 3, wherein in the step of growing a group III nitride crystal the group III nitride crystal is grown while the crystal growth face is kept flat.

7. The method for producing a group III nitride crystal according to claim 6, wherein
in the step of growing a group III nitride crystal on the main planes of the substrates,
when the plane orientation of the main planes has an off-angle of five degrees or less with respect to {20-21}, the group III nitride crystal has a growth rate below 80 μm/h,
when the plane orientation of the main planes has an off-angle of five degrees or less with respect to {20-2-1}, the group III nitride crystal has a growth rate below 90 μm/h, when the plane orientation of the main planes has an off-angle of five degrees or less with respect to {22-41}, the group III nitride crystal has a growth rate below 60 μm/h, and when the plane orientation of the main planes has an off-angle of five degrees or less with respect to {22-4-1}, the group III nitride crystal has a growth rate below 80 μm/h.

8. The method for producing a group III nitride crystal according to claim 3, further comprising the steps of:

preparing an additional group III nitride crystal substrate having a main plane from the group III nitride crystal, the main plane having a plane orientation with an off-angle of five degrees or less with respect to a crystal-geometrically equivalent plane orientation selected from the group consisting of {20-21}, {20-2-1}, {22-41}, and {22-4-1}; and growing an additional group III nitride crystal on the main plane of the additional group III nitride crystal substrate.

\* \* \* \* \*

UNITED STATES PATENT AND TRADEMARK OFFICE
CERTIFICATE OF CORRECTION

PATENT NO. : 8,524,575 B2
APPLICATION NO. : 13/338263
DATED : September 3, 2013
INVENTOR(S) : Koji Uematsu et al.

It is certified that error appears in the above-identified patent and that said Letters Patent is hereby corrected as shown below:

On Title Page 2, at Item (56), References Cited, under the heading FOREIGN PATENT DOCUMENTS, the third- and fourth-listed reference-identifying entries,

"JP 2008-13772 A 6/2008
JP 2009-52250 A 6/2009"

should read:

--JP 2008-143772 A 6/2008
JP 2009-524250 A 6/2009--.

Signed and Sealed this
Twenty-second Day of April, 2014

Michelle K. Lee
*Deputy Director of the United States Patent and Trademark Office*